(12) United States Patent
Hohn et al.

(10) Patent No.: US 11,702,748 B2
(45) Date of Patent: Jul. 18, 2023

(54) WAFER LEVEL UNIFORMITY CONTROL IN REMOTE PLASMA FILM DEPOSITION

(71) Applicant: Lam Research Corporation, Fremont, CA (US)

(72) Inventors: Geoffrey Hohn, Portland, OR (US); Huatan Qiu, Lake Oswego, OR (US); Rachel Batzer, Tigard, OR (US); Guangbi Yuan, Beaverton, OR (US); Zhe Gui, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 365 days.

(21) Appl. No.: 15/449,333

(22) Filed: Mar. 3, 2017

(65) Prior Publication Data

US 2018/0251893 A1  Sep. 6, 2018

(51) Int. Cl.
*C23C 16/458* (2006.01)
*H01L 21/687* (2006.01)
*C23C 16/505* (2006.01)

(52) U.S. Cl.
CPC ...... *C23C 16/4585* (2013.01); *C23C 16/4581* (2013.01); *C23C 16/4586* (2013.01); *C23C 16/505* (2013.01); *H01L 21/68742* (2013.01); *H01L 21/68757* (2013.01); *H01L 21/68785* (2013.01)

(58) Field of Classification Search
None
See application file for complete search history.

(56) References Cited

U.S. PATENT DOCUMENTS

| 5,366,585 A | 11/1994 | Robertson et al. |
| 5,556,500 A | 9/1996 | Hasegawa et al. |

(Continued)

FOREIGN PATENT DOCUMENTS

| CN | 105702617 A | 6/2016 |
| CN | 105719989 A | 6/2016 |

(Continued)

OTHER PUBLICATIONS

CN Office Action dated Sep. 5, 2022, in Application No. CN201810180320.8 with English translation.

(Continued)

*Primary Examiner* — David P Turocy
(74) *Attorney, Agent, or Firm* — Weaver Austin Villeneuve & Sampson LLP

(57) ABSTRACT

An assembly for use in a process chamber for depositing a film on a wafer. The assembly includes a pedestal having a pedestal top surface extending from a central axis of the pedestal to an outer edge, the pedestal top surface having a plurality of wafer supports for supporting a wafer. A pedestal step having a step surface extending from a step inner diameter towards the outer edge of the pedestal. A focus ring rests on the step surface and having a mesa extending from an outer diameter of the focus ring to a mesa inner diameter. A shelf steps downwards from a mesa surface at the mesa inner diameter, and extends between the mesa inner diameter and an inner diameter of the focus ring. The shelf is configured to support at least a portion of a wafer bottom surface of the wafer at a process temperature.

8 Claims, 12 Drawing Sheets

(56) References Cited

U.S. PATENT DOCUMENTS

| | | | | |
|---|---|---|---|---|
| 6,184,154 | B1* | 2/2001 | Dietze | C30B 25/12 |
| | | | | 438/762 |
| 6,197,117 | B1* | 3/2001 | Li | H01L 21/681 |
| | | | | 118/728 |
| 6,454,866 | B1* | 9/2002 | Halpin | H01L 21/68792 |
| | | | | 118/500 |
| 6,596,086 | B1* | 7/2003 | Honma | C30B 25/12 |
| | | | | 118/500 |
| 2005/0078953 | A1* | 4/2005 | Fodor | C23C 16/46 |
| | | | | 392/418 |
| 2008/0087382 | A1 | 4/2008 | Sugiyama et al. | |
| 2008/0314319 | A1* | 12/2008 | Hamano | H01L 21/68742 |
| | | | | 118/728 |
| 2011/0073037 | A1* | 3/2011 | Ohnishi | H01L 21/68735 |
| | | | | 118/641 |
| 2011/0116207 | A1 | 5/2011 | Sato et al. | |
| 2013/0000848 | A1* | 1/2013 | Wongsenakhum | |
| | | | | H01L 21/68735 |
| | | | | 156/345.34 |
| 2013/0025538 | A1* | 1/2013 | Collins | H01L 21/67115 |
| | | | | 118/712 |
| 2013/0155568 | A1 | 6/2013 | Todorow et al. | |
| 2016/0177444 | A1 | 6/2016 | Baldasseroni et al. | |
| 2016/0181142 | A1 | 6/2016 | Raj et al. | |
| 2016/0225644 | A1* | 8/2016 | Ishida | H01L 21/68728 |
| 2016/0225664 | A1 | 8/2016 | Huang et al. | |
| 2017/0002465 | A1 | 1/2017 | Shaikh et al. | |
| 2017/0287770 | A1* | 10/2017 | Gangakhedkar | |
| | | | | H01L 21/68771 |
| 2018/0100235 | A1* | 4/2018 | Nogami | H01L 21/677 |

FOREIGN PATENT DOCUMENTS

| | | | |
|---|---|---|---|
| CN | 106024567 | A | 10/2016 |
| EP | 0525633 | A1 | 2/1993 |
| EP | 0663682 | A1 | 7/1995 |
| EP | 0714998 | A1 | 6/1996 |
| EP | 0780490 | A1 | 6/1997 |
| EP | 1055252 | A1 | 11/2000 |
| JP | 2001-527285 | A | 12/2001 |
| JP | 2001525495 | | 12/2001 |
| JP | 2002502555 | | 1/2002 |
| JP | 2002-134484 | A | 5/2002 |
| JP | 2008103403 | A | 5/2008 |
| JP | 2008193403 | | 8/2008 |
| JP | 2011-108816 | A | 6/2011 |
| JP | 3172327 | U | 12/2011 |
| JP | 2013528943 | | 7/2013 |
| JP | 2013175543 | A * | 9/2013 |
| JP | 2017017316 | | 1/2017 |
| KR | 10-2007-0009159 | | 1/2007 |
| KR | 10-2014-0101870 | | 8/2014 |
| KR | 10-2016-0075351 | | 6/2016 |
| TW | 201705352 | | 6/2016 |
| WO | WO98/56102 | | 12/1998 |
| WO | WO199856102 | | 12/1998 |
| WO | WO9928945 | A1 | 6/1999 |
| WO | WO199928945 | | 6/1999 |
| WO | WO199933087 | | 7/1999 |
| WO | WO99/41773 | | 8/1999 |
| WO | WO2012/141722 | | 10/2012 |

OTHER PUBLICATIONS

CN Office Action dated Sep. 5, 2022, in Application No. CN201810180320.8.
CN Office Action issued in Application No. 201810180320.8 dated May 24, 2022.
CN Office Action issued in Application No. 201810180320.8 dated Dec. 14, 2022.
CN Office Action issued in Application No. 201810180320.8 dated Apr. 21, 2022.
JP Office Action issued in Application No. 2018-037155 dated Mar. 15, 2022.
KR Office Action issued in Application No. 10-2018-0025117 dated Apr. 26, 2022.
TW Office Action issued in Application No. 107106753 dated Jul. 27, 2021.

* cited by examiner

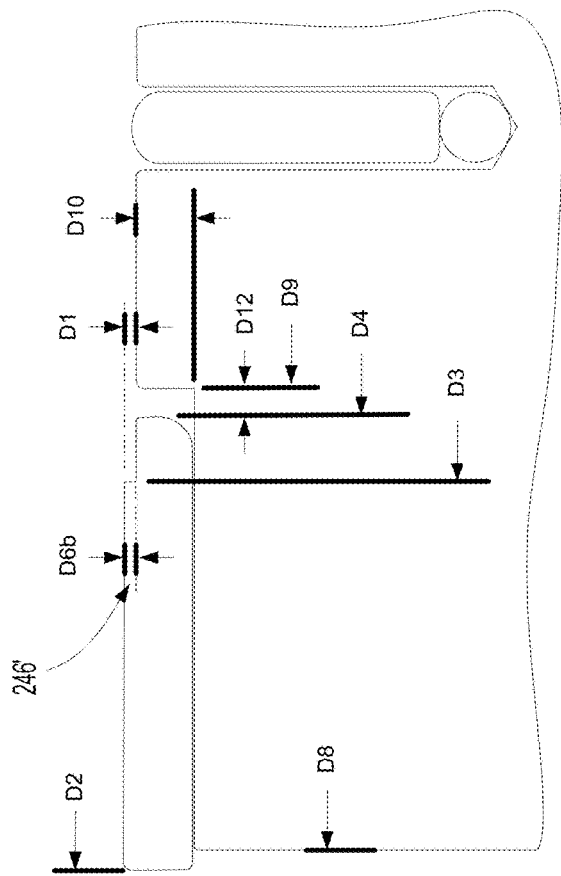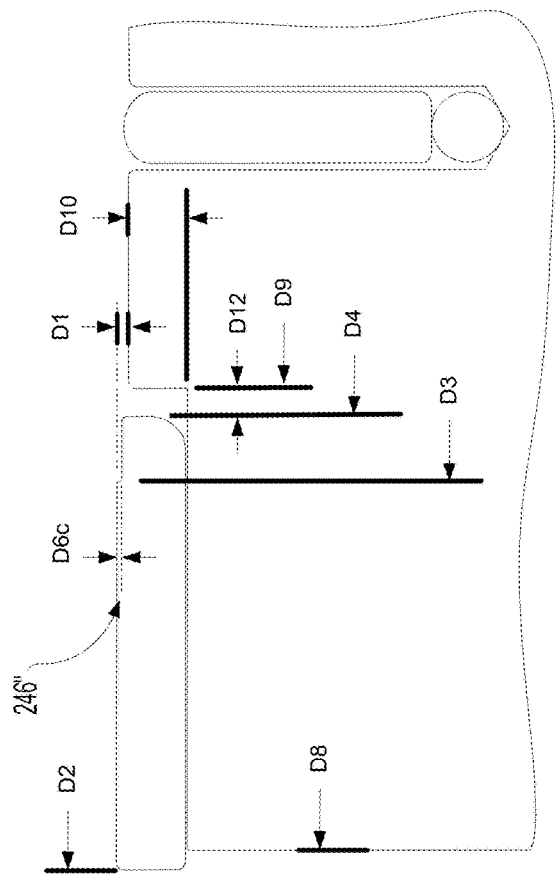
FIG. 2E
FIG. 2F

WAFER LEVEL UNIFORMITY CONTROL IN REMOTE PLASMA FILM DEPOSITION

TECHNICAL FIELD

The present disclosure is related to semiconductor substrate processing methods and equipment tools, and more particularly, to a designed set of geometries of a pedestal configuration to control uniformity of deposition.

BACKGROUND OF THE DISCLOSURE

Improved film uniformity is important in plasma-enhanced chemical vapor deposition (PECVD) and plasma atomic layer deposition (ALD) technologies. The chamber systems implementing PECVD and ALD are associated with a hardware signature that contributes to nonuniform film deposition. For example, the hardware signature can be associated with chamber asymmetry and with pedestal asymmetry. Furthermore, many processes experience azimuthal nonuniformity of various origins. In particular, multi-station modules performing PECVD and ALD feature a large, open reactor that may contribute to azimuthal nonuniformities and edge drop effects. Nonuniformities also exist in single station modules, due to nonuniform physical chamber geometries including those caused by assembly and component manufacturing tolerances. As customers push to locate die ever closer to the wafer edge, the numerical contribution of this azimuthal nonuniformity to overall nonuniformity grows. Despite best efforts to minimize damage and/or non-uniform deposition profiles, traditional PECVD and plasma ALD schemes still need improvement.

Remote plasma processes are used to deposit a carbide film (e.g., striker carbide) on a wafer. The plasma is placed relatively far away from the wafer surface. Radicals are then transported to the chamber and react with gases that once distributed deposit a unique carbide film on the wafer. The current technology uses a standard pedestal designed for PECVD applications for close capacitively coupled plasma showerheads for remote plasma processes.

However, the standard pedestal configuration does not provide the desired flow profile and/or material conditions near the edge of the wafer in remote plasma processing. The result of the current configuration using PECVD hardware near the wafer results in a lower edge deposition profile. Furthermore, uniformity degrades over time, primarily at wafer edge, where it is most sensitive to the flow profile and local conditions, creating the need to maintain a stable edge condition at all times. Specifically, PECVD techniques were designed on ideal conditions including direct/in-situ capacitive coupling plasma processing between a showerhead and pedestal, which introduce nonuniformities when applied to remote plasma processes. For example, wafer ring and pedestal pocket designs were based on ideal conditions for PECVD products with direct/in-situ capacitive coupling plasma processing between showerhead and pedestal. Features and materials chosen reflect the requirements of local plasma. These current features were specifically designed with the intent of controlling the effects of the in-situ plasma at the wafer edge including enhancement of deposition, suppression of harmful discharges, and reduction of particle creation. These concerns are unrelated to remote plasma processing (e.g., striker carbide formation does not require local plasma tuning), but the geometries and materials driven by PECVD would have a negative impact to the on wafer performance (e.g., uniformity) of remote plasma processing. In short, the use of these standard PECVD techniques including a baseline reactor using a standard PECVD pedestal configuration for remote plasma CVD processes (e.g., for depositing conformal carbide films) introduces significant non-uniformities ranging from 2.5-10%, especially out near the edge of the wafer. As an illustration, striker carbide formation does not.

It is in this context that disclosures arise.

SUMMARY

Embodiments of the present disclosure relate to the use of remote plasma CVD (RPCVD) to deposit conformal carbide films (e.g., striker carbide). A wafer uniformity control knob is disclosed that optimizes the performance of the conformal carbide film by reducing non-uniform film deposition and reducing film performance degradations (including uniformity and other film characteristics) over time. These non-uniformities are primarily caused but not limited to edge drop effects, wherein nearby geometries, material, and material conditions most likely affect the on wafer performance of the film due to radical depletion, film build up, surface condition shifts, and flow profile near the wafer edge. In particular, in embodiments the wafer level knob is characterized by locally modulating the geometries relative to the wafer, material composition, and surface conditions near the wafer. Controlling these factors allows for elimination of harmful film growth and maintains consistent flow (e.g., especially over at the edge of the wafer) of gas and radicals in order to promote uniform growth of film on the wafer.

In one embodiment, an assembly is described and used in a process chamber for depositing a film on a wafer. The assembly includes a pedestal having a pedestal top surface extending from a central axis of the pedestal to an outer edge. The pedestal top surface includes a plurality of wafer supports configured to support a wafer at a wafer support level above the pedestal top surface. The assembly includes a pedestal step of the pedestal. The pedestal step is defined by a step inner diameter and includes a step surface that extends from the step inner diameter towards the outer edge of the pedestal. The assembly includes a focus ring that is configured to rest on the step surface. The focus ring includes a mesa extending from an outer diameter of the focus ring to a mesa inner diameter. The focus ring includes a shelf stepping downwards from a mesa surface at the mesa inner diameter. The shelf extends between the mesa inner diameter and an inner diameter of the focus ring, and is configured to support at least a portion of a wafer bottom surface of the wafer at a process temperature.

In another embodiment, another assembly is disclosed for use in a process chamber for depositing a film on a wafer. The assembly includes a pedestal having a pedestal top surface extending from a central axis of the pedestal to an outer edge. The pedestal top surface includes a plurality of wafer supports configured to support a wafer at a wafer support level above the pedestal top surface. The assembly includes a pedestal step of the pedestal. The pedestal step is defined by a step inner diameter, and includes a step surface extending from the step inner diameter towards the outer edge of the pedestal. The pedestal step is defined by a step height extending down from the pedestal top surface. The assembly includes a focus ring configured to rest on the step surface. The focus ring includes a mesa extending from an outer diameter of the focus ring to a mesa inner diameter. The focus ring includes a shelf stepping downwards from a mesa surface at the mesa inner diameter, wherein the shelf extends between the mesa inner diameter and an inner diameter of the focus ring. A shelf height relative to a ring bottom surface ranges between 0.143 to 0.188 inches.

In still another embodiment, an assembly for use in a process chamber for depositing a film on a wafer is disclosed. The assembly includes a pedestal having a pedestal top surface extending from a central axis of the pedestal. The pedestal top surface includes a plurality of wafer supports configured to support a wafer at a wafer support level above the pedestal top surface. The assembly includes a raised annular rim configured on the outer edge of the pedestal top surface, and is configured to block lateral movement of the wafer that is resting on the pedestal. The raised annular rim includes a mesa surface rising above the pedestal top surface. The raised annular rim and pedestal top surface form a pocket configured to receive the wafer. A beveled surface is defined on the raised annular rim, wherein the beveled surface extends from an inner diameter of the raised annular rim and to an outer diameter of the pocket on the pedestal top surface. In particular, the beveled surface is angled with respect to the pedestal top surface at an angle of 90 degrees or less, so that the surface may be a flat wall at 90 degrees in one embodiment, or be defined as a beveled transition (e.g., less than 90 degrees).

Other aspects of the disclosure will become apparent from the following detailed description, taken in conjunction with the accompanying drawings, illustrating by way of example the principles of the disclosure.

BRIEF DESCRIPTION OF THE DRAWINGS

The disclosure may best be understood by reference to the following description taken in conjunction with the accompanying drawings in which:

FIG. 2D-1 shows baseline dimensions of the pedestal shown in FIG. 2D at temperature, in accordance with one embodiment of the present disclosure.

FIG. 2E is a magnification of the edge of the pedestal and focus ring of the pedestal assembly of FIG. 2A illustrating proposed dimensions for the geometries promoting improvement of uniformity of film dependent and performance stability over time, wherein the shelf of the focus ring is approximately level with the top surface of the pedestal, in accordance with one embodiment of the present disclosure.

FIG. 2F is a magnification of the edge of the pedestal and focus ring of the pedestal assembly of FIG. 2A illustrating proposed dimensions for the geometries promoting improvement of uniformity of film dependent and performance stability over time, wherein the shelf of the focus ring is above the level of the top surface of the pedestal, in accordance with one embodiment of the present disclosure.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe a pedestal assembly for use in remote plasma processing that implements a new wafer uniformity control knob including a delicately designed set of geometries, surface condition, and material composition nearby the wafer edge to further control the uniformity to improve below 1%, as well as providing stable deposition patterns over time. The critical advantages of implementing the proposed designs (to include controlling the surfaces of the pedestal near the wafer edge using geometry, gas flow, and temperature) would include significant performance improvement of a novel film and enhanced performance stability for remote plasma film deposition. These improvements provide for longer use of pedestal assemblies before performing periodic maintenance. Further, these improvements negate the need for full pedestal assembly replacements at each cycle of periodic maintenance.

With the above general understanding of the various embodiments, example details of the embodiments will now be described with reference to the various drawings.

Figure 1A:
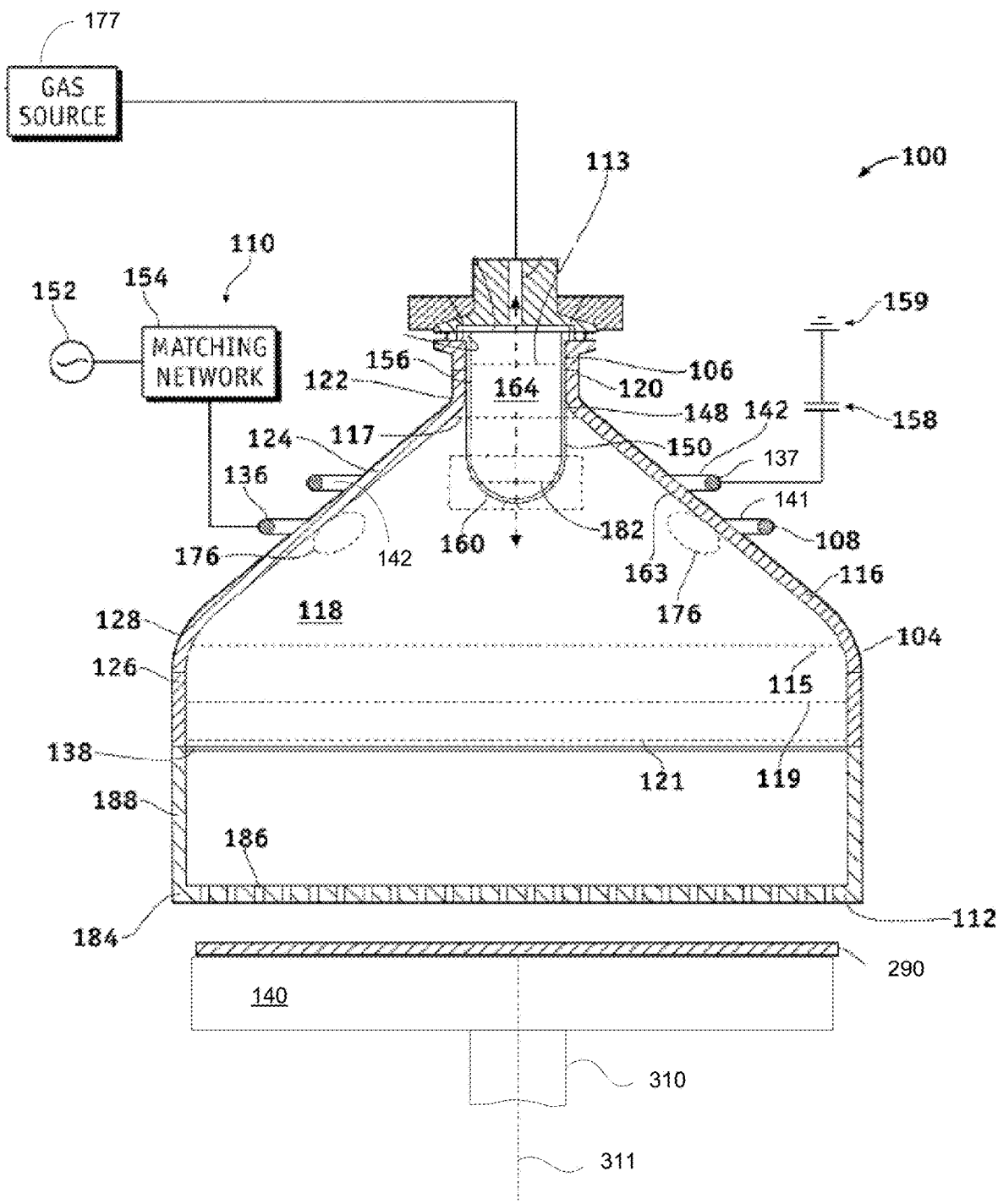
FIG. 1A is a simplified, cross-sectional view of a plasma generator system, in accordance with one embodiment of the present disclosure.

FIG. 1A is a simplified, cross-sectional view of a plasma generator system 100, according to an exemplary embodiment of the present invention. It will be appreciated that, although FIG. 1A illustrates an embodiment of the plasma generator system 100 including certain components, additional components or components shaped differently than those shown in FIG. 1A may alternatively be employed.

The plasma generator system 100 is configured to generate plasma, which may be used to deposit or remove material from a substrate 290 (also referred to throughout as a "wafer"). For example, the plasma generator system 100 may be used in conjunction with systems or components used for various plasma processing techniques, such as remote plasma processing, plasma enhanced chemical vapor deposition, plasma etching, plasma stripping or ashing, sputtering, plasma spraying, and the like. Accordingly, the substrate 290 may be a substrate that may be subjected to one or more of the aforementioned processes. For instance, the substrate 290 may be made of relatively pure silicon, germanium, gallium arsenide, or other semiconductor material typically used in the semiconductor industry, or of silicon admixed with one or more additional elements such as germanium, carbon, and the like, in an embodiment. In another embodiment, the substrate 290 may be a semiconductor substrate having layers that have been deposited thereover during a conventional semiconductor fabrication process. In still another embodiment, the substrate 290 may be a component, such as a sheet of glass, ceramic or metal that may be subjected to plasma processing.

The plasma generator system 100 may be a remote, standalone apparatus or an in-situ module that is incorporated into a processing system. The plasma generator system 100 shown in FIG. 1A is an example of a remote apparatus. In accordance with an exemplary embodiment of the present invention, the plasma generator system 100 includes a container 104, a coil 108, an energy source 110, a gas flow distribution receptacle 106, and a showerhead 112. Although an in-situ module may not be configured identically to the embodiment shown in FIG. 1A, it may include similar components.

The container 104 is configured to receive a processing gas that can be ionized by an electric field and transformed into a plasma, including species such as electrons, ions, and reactive radicals for depositing material onto or removing material from the substrate 290. In an exemplary embodiment, the container 104 is made of a material that is capable of enhancing the electric field. For example, the container 104 may be made of a dielectric material including, but not limited to quartz, aluminum/sapphire, and ceramic. To contain the plasma therein, the container 104 has a sidewall 116 that defines a plasma chamber 118. The sidewall 116 has any thickness that is suitable for containing plasma within the container 104 and that does not interfere with the electric field produced by the coil 108.

The sidewall 116, and hence, the plasma chamber 118, are shaped to allow the plasma to be directed toward the substrate 290. In one exemplary embodiment, the sidewall 116 has a shape that varies along its axial length, as depicted in FIG. 1A. For example, the sidewall 116 may include a neck section 120 extending from an inlet end 122 of a plasma-containing section 124 and a tube section 126 extending from an outlet end 128 of the plasma-containing section 124.

In any case, the plasma-containing section 124 includes an inlet 148 to the plasma chamber 118. According to a preferred embodiment, the plasma-containing section 124 may be cone-shaped and may have an outlet end diameter (shown as dotted line 115) that is greater than an inlet end diameter (shown as dotted line 117). In one exemplary embodiment, the outlet end diameter 115 is also greater than the diameter 113 of the neck section 120.

In accordance with another exemplary embodiment of the present invention, the tube section 126 has a substantially uniform diameter (shown as dotted line 119) that is substantially equal (e.g., .+-.0.5 mm) to the outlet end diameter 115 of the plasma-containing section 124. In another exemplary embodiment, the diameter 119 of the tube section 126 is greater than the outlet end diameter 115 of the plasma-containing section 124. The tube section 126 includes an outlet 138 having a diameter (depicted as dotted line 121) from the plasma chamber 118 that may be at least as large as a diameter of the substrate 290.

According to an exemplary embodiment of the present invention, the neck section 120, the plasma-containing section 124, and the tube section 126 have axial lengths that are substantially unequal to each other. In an exemplary embodiment, the neck section 120 has an axial length that is sufficient to stabilize the gas flow distribution receptacle 104 in the container 106, but not so long as to impede gas flow into the plasma chamber 118 as further discussed below. In such case, the axial length of the neck section 120 is less than that of the plasma-containing section 124 and is less than that of the tube section 126.

To provide an electric field across the plasma chamber 118, the coil 108 surrounds at least a portion of the container 104. In an exemplary embodiment, the coil 108 is a single member made of a conductive material, such as copper. In accordance with another exemplary embodiment, the coil 108 has a first end 136 and a second end 137 between which at least two windings 141, 142 are formed about the container 104. The first end 136 is electrically coupled to the energy source 110. The first winding 141 extends from the first end 136 and makes one complete rotation about the container 104. The second winding 142 is integral with the first winding 141 and encircles the container 104 once, terminating at the second end 137, which is electronically coupled to a capacitor 158 and an electrical ground 159.

The particular positioning of the first winding 141 relative to the second winding 142 may be dependent on a desired position of a toroidally-shaped zone or "plasma zone" 176 in the container 104 at which a maximum plasma density will exist. Specifically, the plasma zone 176 typically forms in a portion of the plasma chamber 118 that is closest to the first winding 141, because the first winding 141 dissipates more energy from energy source 110 into the processing gas than any other portion of the coil 108. As a result, the current received by the first winding 141 produces a voltage that is higher than that of any other portion of the coil 108 section. Thus, if a desired location of the plasma zone 176 is to be located a particular axial distance from the substrate 290, then the first winding 141 is disposed accordingly at a position along the axial length of the container 104. According to an exemplary embodiment, at least two windings 141, 142 are included. In particular, the first winding 141 ensures at least one closed loop is formed to thereby produce a more stable plasma in the plasma chamber 118, and the inclusion of the second winding 142 enhances uniformity of the plasma in the plasma chamber 118. Though more windings may be included in other embodiments, they are not necessary, as the inclusion of the additional windings does not adversely affect nor substantially improve the production or quality of plasma in the plasma zone 176.

To form the plasma zone 176, the energy source 110 is electrically coupled directly to the first end 136 of the coil 108 to form a circuit. The energy source 110 may be a radio frequency (RF) voltage source or other source of energy capable of energizing the coil 108 to form an electric field. In an exemplary embodiment, the energy source 110 includes an RF generator 152 that is selected for an ability to operate at a desired frequency and to supply a signal to the coil 108. For example, the RF generator 152 may be selected to operate within a frequency range of about 0.2 MHz to about 20.0 MHz. In one exemplary embodiment, the RF generator 152 may operate at 13.56 MHz. In an exemplary embodiment, the energy source 110 may include a matching network 154 disposed between the RF generator 152 and the coil 108. The matching network 154 may be an impedance matching network that is configured to match an impedance of the RF generator 152 to an impedance of the coil 108. In this regard, the matching network 154 may be made up of a combination of components, such as a phase angle detector and a control motor; however, in other embodiments, it will be appreciated that other components may be included as well.

In another exemplary embodiment of the circuit 200, the capacitor 158 is included to limit voltage flow through the coil 108. In this regard, the capacitor 158 is selected to have a capacitance that limits a peak-to-peak voltage flow through the coil 108 to a threshold voltage. According to an exemplary embodiment of the present invention, the threshold voltage may depend on an impedance value of the coil 108 and the RF generator 152. According to another exemplary embodiment of the present invention, the capacitor 158 is also selected for an ability to enhance the impedance-matching capabilities of the matching network 154 to match the impedance of RF generator 152 to that of the coil 108. In any case, the capacitor 158 is electrically coupled to the second end 137 of the coil 108 between the coil 108 and the electrical ground 159.

To maximize system operability, the coil 108 is disposed at an optimum location around the container 104 that minimizes a volume within the plasma chamber 118 occupied by the plasma zone 176 and maximizes the density of plasma in the plasma zone 176. Additionally, each winding 141, 142 is disposed a suitable, substantially uniform distance away from the surface of the container 104 so that the plasma zone 176 forms within the plasma chamber 118 adjacent to an inner surface 163 of the container 104. In this way, the container inner surface 163 may guide the reactive radicals toward the chamber outlet 138 during processing. For example, in an exemplary embodiment, the coil 108 may be in a range of 10 mm and 30 mm away from the container.

The processing gas may be diffused before injection into the plasma chamber 118 to substantially uniformly distribute the gas to the plasma zone 176. In this regard, in one exemplary embodiment, the gas flow distribution receptacle 106 is disposed in the plasma chamber inlet 148 and has any one of numerous shapes, depending on the location of the plasma zone 176 in the container 104. According to one exemplary embodiment, the gas flow distribution receptacle 106 includes a cup member 150 and is made of a material that is non-conductive and is capable of withstanding corrosion when exposed to the processing gas. Suitable materials include, for example, dielectric materials such as quartz.

The cup member 150 may include a cylindrical section 156 and a rounded section 160. The cylindrical section 156 may define a portion of a reception cavity 164 having an open end 161. Gas injection openings 182 are included within the rounded section 160 and are adapted to provide flow communication between the reception cavity 164 and the plasma chamber 118. To control the manner in which the processing gas is injected into the plasma chamber 118, the gas injection openings 182 may be formed and positioned so that the processing gas flows along predetermined gas injection paths. The gas injection paths generally allow the gas to flow axially from a first location in the reception cavity 164 through openings 182 to a second location substantially (e.g., .+−.0.5 mm) adjacent to or over the plasma zone 176.

The number of openings 182, the size of the openings 182, and the direction in which the openings 182 are formed relative to an outer surface 169 of the receptacle 106 may be further selected to control the manner in which the gas is injected. For example, to substantially evenly distribute the processing gas within the plasma chamber 118, thirty to forty openings 182 may be included. In one particular example, twenty-four openings 182 may be included. In other embodiments, more or fewer openings 182 may be included. In one exemplary embodiment, the openings 182 are disposed symmetrically about the longitudinal axis 171 and are substantially evenly spaced around a circumference of the rounded section 160 to form a ring. In another exemplary embodiment, the openings 182 are not evenly spaced around a circumference of the rounded section 160. For example, sets of two or more openings may be formed close together, and each set may be equally spaced from the longitudinal axis 171. In any case, the openings 182 are spaced such that the processing gas may be substantially evenly injected into the plasma chamber 118.

When the energy source 110 energizes the coil 108, an electric field is formed in a selected portion of the plasma chamber 118 to thereby ionize the processing gas that may flow therethrough to form ionized gas. As used herein, the term "ionized gas" may include, but is not limited to, ions, electrons, neutral species, excited species, reactive radicals, dissociated radicals, and any other species that may be produced when the processing gas flows through the electric field. To control dispersion of the ionized gas across the work piece 290, the showerhead 112 may be positioned at the plasma chamber outlet 138. In one exemplary embodiment, the showerhead 112 includes a plate 184. The plate 184 may be made from any suitable material that is relatively inert with respect to the plasma, such as aluminum or ceramic. Generally, the plate 184 is sized to allow gas dispersion over an entirety of the substrate 290 and thus, has a correspondingly suitable diameter.

To allow gas passage therethrough, the plate 184 is relatively porous. In particular, the plate 184 includes through-holes 186 that are suitably sized and spaced to disperse the ionized gas over the work piece 290 in a substantially uniform manner Additionally, the through-holes 186 are disposed in a substantially uniform pattern on the showerhead 112, in one exemplary embodiment but, in another exemplary embodiment, the through-holes 186 are disposed in a non-uniform pattern.

In an exemplary embodiment of the present invention, the showerhead 112 is directly coupled to the container 104, as shown in FIG. 1A. For example, the showerhead 112 may include sidewalls 188 that extend axially from the plate 184 and that are coupled to the container 104 via bolts, clamps, adhesives or other fastening mechanisms. In another embodiment, the showerhead 112 may be integral with the container 104. The sidewalls 188 may be used to provide additional distance between the plasma zone 176 and the substrate 290, and thus, may be configured accordingly.

Figure 1B:
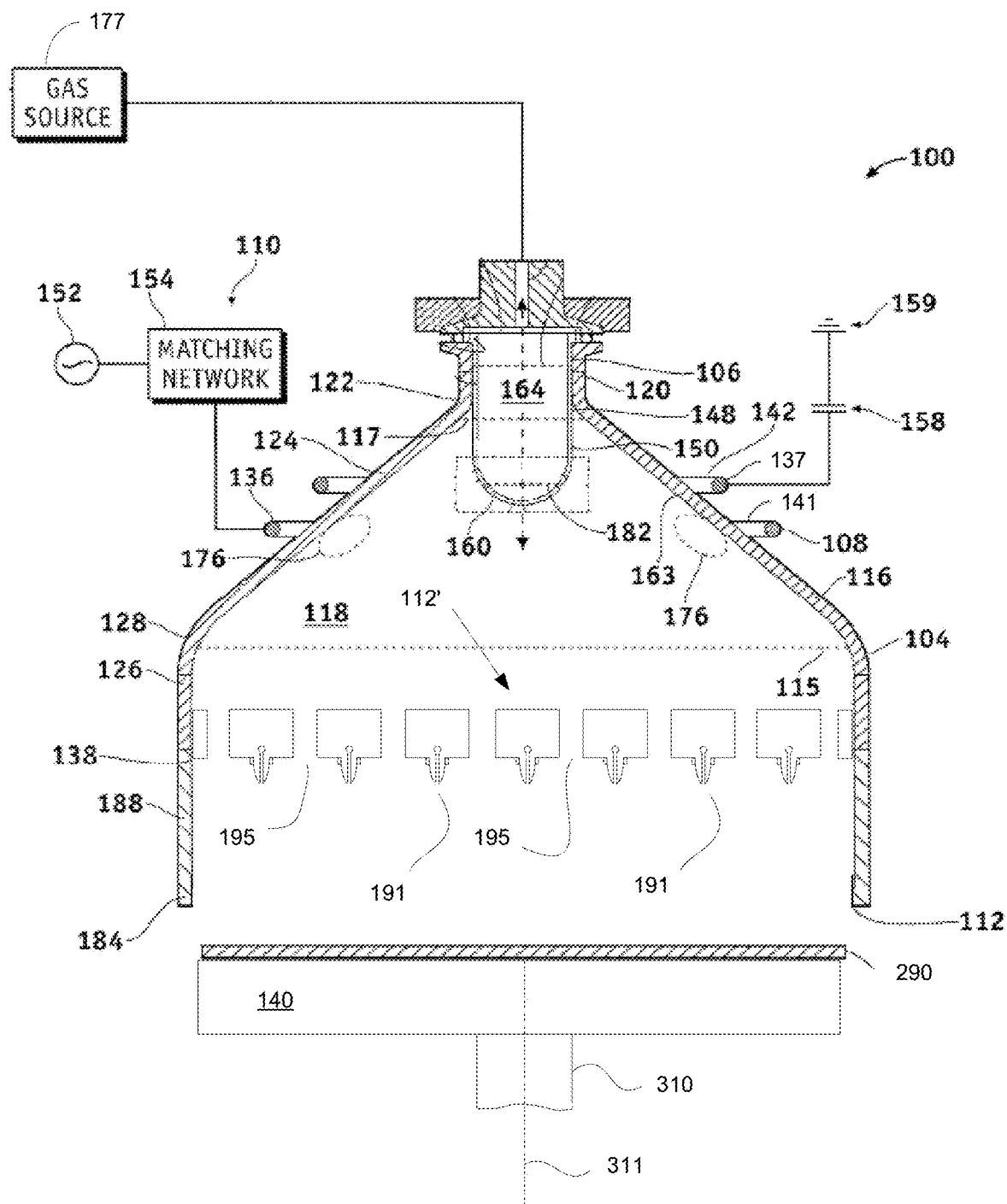
FIG. 1B is a cross-sectional view of a plasma generator system and illustrates a showerhead having a plurality of nozzles configured for injecting precursor into the chamber, in accordance with one embodiment of the present disclosure.

FIG. 1B is a simplified, cross-sectional view of a plasma generator system 100B that is configured for remote plasma deposition processes, in accordance with one embodiment of the present disclosure. Plasma generator system 100B is similar in configuration to the plasma generator system 100 of FIG. 1A, wherein like components are represented by like reference numerals. For example, plasma generator system 100B includes a container 104, a coil 108, an energy source 110, a gas flow distribution receptacle 106, and a showerhead 112'. The plasma generator system 100B illustrates a close-up view of the showerhead 112'. In particular, the showerhead 112' of plasma generator system 100B may be configured within the plasma chamber 118, such that when the pedestal 140 is moved to a position within the plasma chamber 118, remote plasma deposition can be performed within the chamber. Both the plasma generator systems 100A and 100B may be used for PECVD, ALD, or remote ALD processes.

For example, the plasma generator system 100B may deposit one or more films implementing an ALD process, which is also known as atomic layer chemical vapor deposition (ALCVD). ALD produces very thin films that are highly conformal, smooth, and possess excellent physical properties. ALD uses volatile gases, solids, or vapors that are sequentially introduced (or pulsed) over a heated substrate. In one ALD cycle, films are formed via alternating self-limiting chemical surface reactions resulting in conformal thin film formation, wherein four operations are performed and can be defined as an A-P-B-P sequence. In step A, a first precursor is introduced as a gas, which is absorbed (or adsorbed) into the substrate. In step P right after step A, the reactor chamber is cleared of the gaseous precursor. In step B, a second precursor is introduced as a gas, which reacts with the absorbed precursor to form a monolayer of the desired material. In step P right after step B, the reactor chamber is again cleared of the gaseous second precursor. By regulating this A-P-B-P sequence, the films produced by ALD are deposited a monolayer at a time by repeatedly switching the sequential flow of two or more reactive gases over the substrate. In that manner, the thickness of the film may be regulated depending on the number of cycles performed of the A-P-B-P sequence.

Further, the plasma generator system 100B may implement a remote plasma enhanced ALD deposition process, wherein in the A-P-B-P sequence described above, the second precursor includes radicals formed via plasma generation. In particular, the plasma does not come into direct contact with the substrate 290. That is, the substrate 290 is placed remote from the plasma source (e.g., plasma containing-section 124 near windings 141-142). The plasma flowing into the chamber 118 produces radicals and energetic ions, which function as the second, non-metal precursor. Because the radicals react very rapidly with the precursor, plasma enhanced or assisted ALD allows for deposition at much lower temps, and usually with better film properties. In addition, because the plasma is remote from the substrate 290, energetic ion and electron bombardment of the substrate 290 is minimized or removed, thereby preventing substrate surface damage and contamination through dissociation with by-products or adsorbed precursors (e.g., formed through precursor decomposition).

Showerhead 112' includes a plurality of nozzles 191 that is configured for injecting the first precursor into the chamber 118. A layer of the first precursor adsorbs onto the wafer 290 resting on the pedestal 140 that is placed within the boundaries of chamber 118. After purging the first precursor from chamber 118, radicals formed from plasma translate down to the wafer 290 via through-holes 195.

Figure 2A:
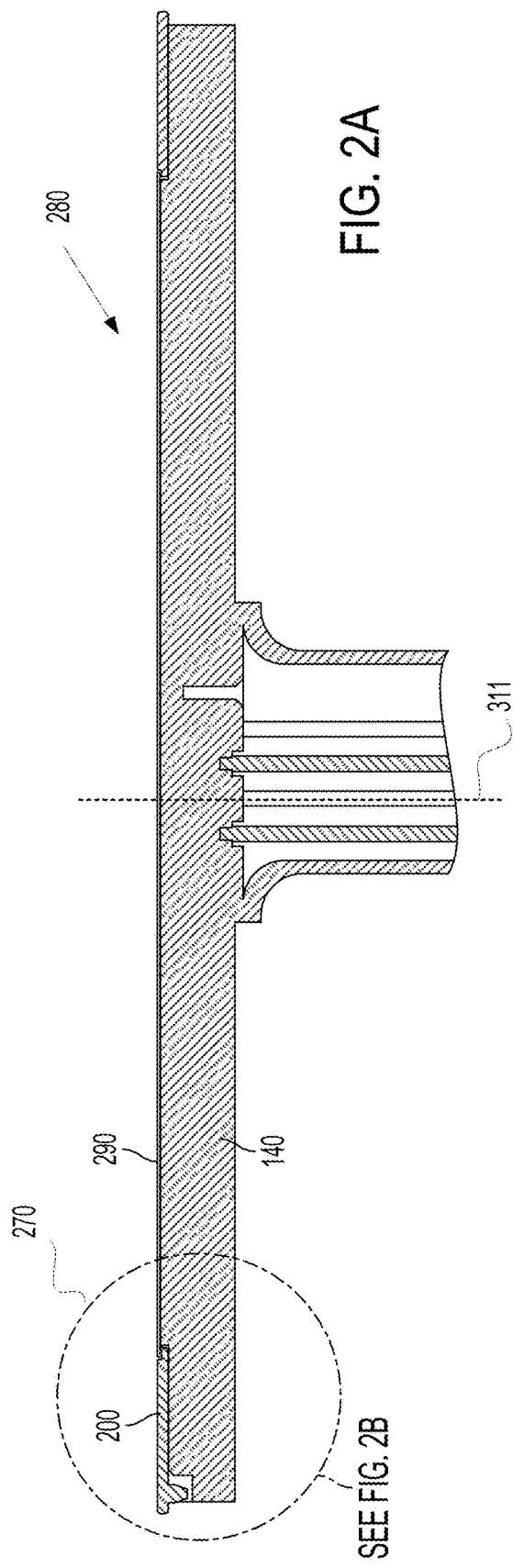
FIG. 2A is a cross-sectional view of a pedestal assembly including a pedestal, wherein an edge of the pedestal and focus ring having geometries promoting improvement of the uniformity of film deposition and performance stability over time, in accordance with one embodiment of the present disclosure.

FIG. 2A is a cross-sectional view of a pedestal assembly 280 including a pedestal 140, wherein an edge of the pedestal and focus ring 200 have geometries promoting improvement of film deposition uniformity and deposition performance stability over multiple process cycles especially when performing remote plasma processing, in accordance with one embodiment of the present disclosure. In particular, pedestal assembly 280 is shown having a delicately designed set of geometries to promote uniform film deposition over a wafer 290, including at the wafer edge. Embodiments of the present invention control surface conditions of the pedestal assembly 280 that are near the edge of the wafer during processing with specific geometries in order to minimize flow/material from forming contaminants in that affected area. For example, the novel configuration of the pedestal assembly 280 minimizes flow/material from interacting with the bottom of the wafer by restricting flow/material movement at the edge near the focus ring 200. In that manner, the surface conditions of the pedestal assembly 280 near the edge of the wafer 290 are optimized for flow/material interaction, and the optimization promotes stable surface conditions of the pedestal assembly 280 over multiple deposition process cycles. As such, the period between required maintenance on the plasma chamber may be increased as the performance characteristics of the plasma chamber is maintained for longer periods of time due to reduced deposition degradation.

Specifically, FIG. 2A illustrates a cross-sectional view of pedestal 140 with a magnification of the outer region 270 of pedestal assembly 280. As shown, a wafer 290 rests on pedestal 140 and extends close to the outer edge 221, in FIG. 2B, of the pedestal 140. The focus ring 200 sits in the outer region 270, and more specifically sits near an outer region 145 of the pedestal 140 on a pedestal step 230. Extensions 203 within the focus ring 200 prevent movement of the focus ring 200 during processing, as will be further described in relation to FIG. 2C.

Figure 2B:
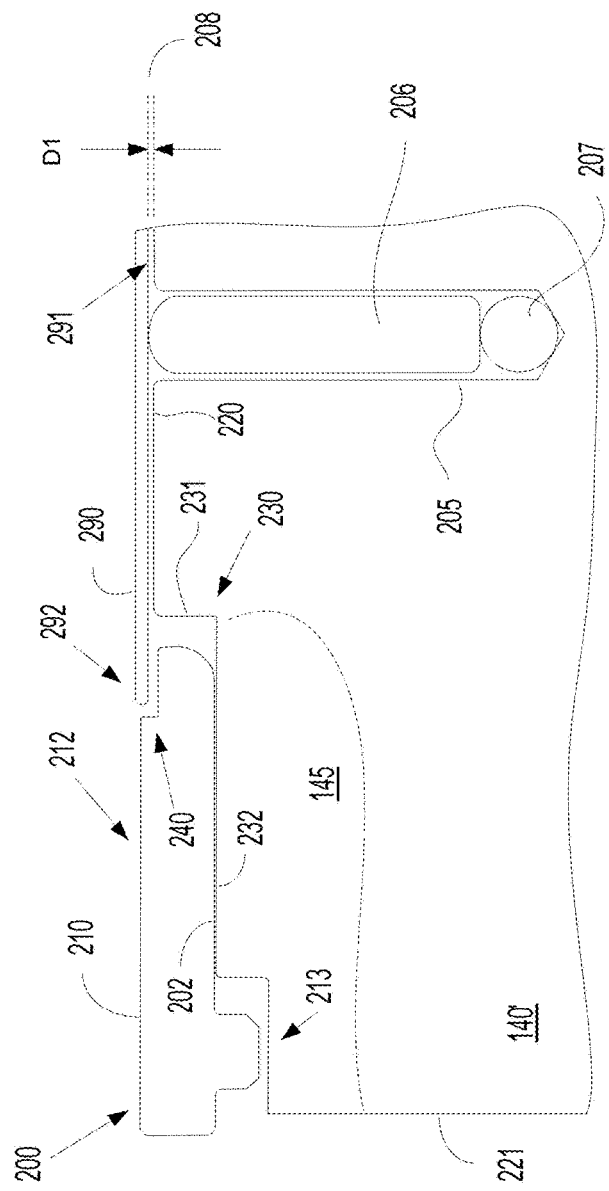
FIG. 2B is a magnification of the edge of the pedestal and focus ring of the pedestal assembly of FIG. 2A, in accordance with one embodiment of the present disclosure.

FIG. 2B shows more detail of the outer region 270 of the pedestal 140' and focus ring 200 of the pedestal assembly 280 of FIG. 2A, in accordance with one embodiment of the present disclosure. In particular, FIG. 2B illustrates geometries of the pedestal 140' and focus ring 200 promoting uniform film deposition when performing remote plasma processing, wherein pedestal 140' is configured to cooperatively mate with the focus ring 200 when performing remote plasma processing. In addition, the optimized geometries provide for deposition performance stability over multiple process cycles when performing remote plasma processing.

The pedestal assembly 280 includes a pedestal 140' having a pedestal top surface 220. As shown, the pedestal top surface 220 and pedestal 140' extend from a central axis 311 of the pedestal 140' to an outer edge 221 of the pedestal. Although not shown in FIGS. 2A-2F, a lift pin assembly may be configured within the pedestal assembly 280, such that lift pins may project through the pedestal 140' (for example, as the pedestal 140' is raised in relation to the fixed lift pins) to support the wafer when the wafer is introduced into the plasma chamber 118 and removed from the plasma chamber 118. Specifically, a lift pin assembly includes a plurality of lift pins extending through a plurality of pedestal shafts configured within the pedestal 140'.

In addition, the pedestal top surface 220 includes a plurality of wafer supports 206 configured to support the wafer 290 at a wafer support level 208 above the pedestal top surface. Each of the wafer supports 206 sits within a hole 205 that opens up at the top surface 220. Each wafer support 206 may further rest on a compliant spacer 207 that sits at the bottom of hole 205. Compliant spacer 207 is configured to prevent the wafer supports 206 (e.g., formed from sapphire) from breaking when a wafer 290 is placed thereon and/or for height modulation. In one embodiment, the configuration of the wafer supports 206 within the pedestal 140' is important to optimize performance of the pedestal assembly 280 when implemented for remote plasma processing, such as improved uniformity of film deposition and improved deposition performance stability. In one embodiment, the positioning of the wafer supports 206 within hole 205 is configured to minimize the distance of the wafer support level 208 (dimension "D1" ranging approximately between 5 and 15 mil).

Pedestal 140' includes a pedestal step 230 defined by a step riser 231 and a step surface 232. The step riser 231 is located at a step inner diameter 233 of the pedestal 140', wherein the step riser 231 rises from the step surface 232 at the step inner diameter 233. In addition, the step surface 232 extends from the step inner diameter 233 towards the outer edge 221 of the pedestal. In the cross-section of pedestal 140' shown in FIG. 2B, an engagement location 213 is configured at the outer edge 221, such that the step surface 232 stops at the engagement location 213. In other cross-sections of pedestal 140', the step surface 232 may extend all the way to the outer edge 221 of pedestal 140', such as on the right side of the pedestal assembly 280 shown in FIG. 2A.

The pedestal assembly 280 includes a focus ring 200 that is configured to rest on the step surface 232. As shown, the bottom surface 202 of the focus ring 200 rests on the step surface 232. In particular, the focus ring 200 includes an inner diameter 241 and an outer diameter 247, such that the focus ring 200 may form an annular ring having a thickness between the inner diameter 241 and outer diameter 247. In addition, the focus ring 200 includes a mesa 212 that extends from an outer diameter 247 to a mesa inner diameter 211. The mesa 212 includes a mesa surface 210.

The focus ring 200 includes a shelf 240 that is configured to step downwards from the mesa surface 210 at the mesa inner diameter 211. The shelf extends between the mesa inner diameter 211 and an inner diameter of the focus ring 241. As will be described more fully below, the shelf 240 is configured to support at least a portion of a wafer bottom surface 291 of the wafer 290 at a process temperature. That is, the shelf 240 is configured to support at least a portion of a wafer bottom surface 291 of the wafer 290 during processing. The wafer 290 may form a shape wherein the outer edge of the wafer has a wavy shape, such that the wafer 290 takes on a slight potato chip shape. As such, one or more contact points and/or regions of the edge 292 contact the shelf 240.

Because the spacing between the edge 292 of wafer 290 and the bottom surface 291 of wafer 290 is reduced, flow/material (e.g., precursor and/or radicals) are prevented from forming and/or occupying the region near the junction where the wafer 290, ring shelf 240 and pedestal step 230 meet. That is, the focus ring substantially touches the bottom surface 291 of the wafer 290 during processing. In that manner, because the spacing is reduced resulting in limited deposition of precursor and/or radicals contaminants due to lingering precursor and/or radicals present in that described spacing are prevented from being deposited on the focus ring 200 near the shelf 240 and/or on the pedestal 140' near the step 230. As such, contamination of the wafer top surface 291 which leads to non-uniformities in wafer deposition near the edge 292 of the wafer is also reduced. In traditional pedestal assemblies, the focus ring 200 does not touch the wafer 290 during processing, and as such, precursor and radical deposition occurs on the focus ring 200 and outer region 145 of the pedestal near the junction where the wafer 290, ring shelf 240 and pedestal step 230 meet, which leads to contamination of the focus ring 200 and pedestal 140' resulting in poor performance stability over multiple deposition cycles, and non-uniformities in film deposition.

Figure 2C:
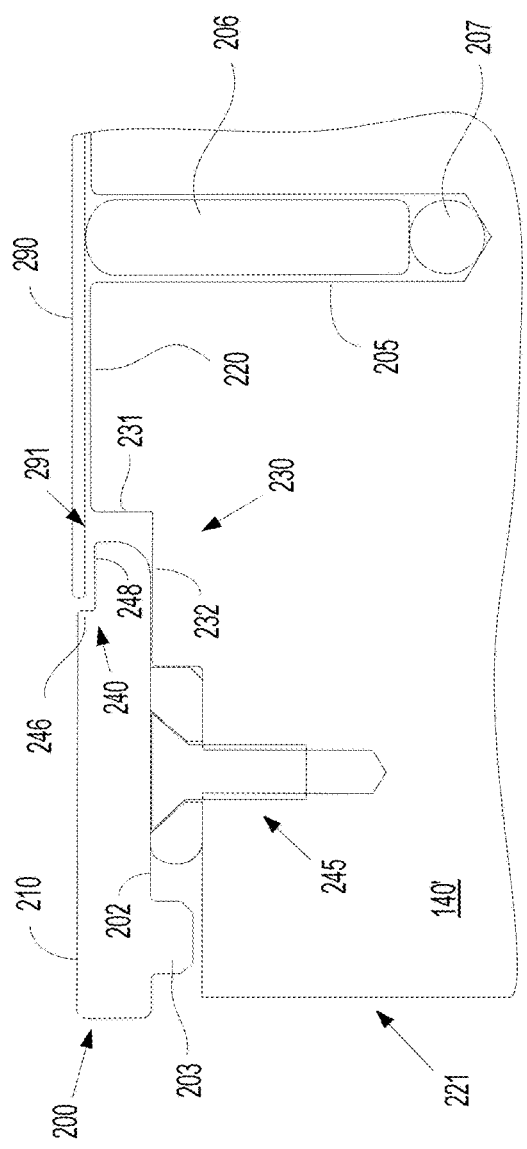
FIG. 2C is a magnification of the edge of the pedestal and focus ring of the pedestal assembly of FIG. 2A including an extension configured in the focus ring, in accordance with one embodiment of the present disclosure.

FIG. 2C is a magnification of the outer region 270 of the pedestal 140' of the pedestal assembly 280 of FIG. 2A including one or more extensions 203 configured to prevent movement of the focus ring 200 during processing, in accordance with one embodiment of the present disclosure. In particular, the focus ring 200 includes a plurality of extensions 203 configured to secure the focus ring 200 to the pedestal 140. The extensions 203 are configured to prevent the focus ring 200 from shifting during processing. The extensions 203 are configured to sit in the engagement locations 213 as shown in FIG. 2B.

In addition, a focus ring support configuration 245 is also shown. That is, the pedestal 140' includes one or more focus ring support configurations 245 distributed appropriately in order to support the focus ring evenly above the step 230 of the pedestal 140'. The focus ring support configurations 245 may be adjusted to achieve a desired height 204 of the mesa surface 210 above the pedestal top surface 220, for example. Also, the focus ring support configurations 245 may be adjusted to achieve a desired separation between the bottom surface 202 of the focus ring 200 and the step surface 232 of the pedestal 140'.

Figure 2D:
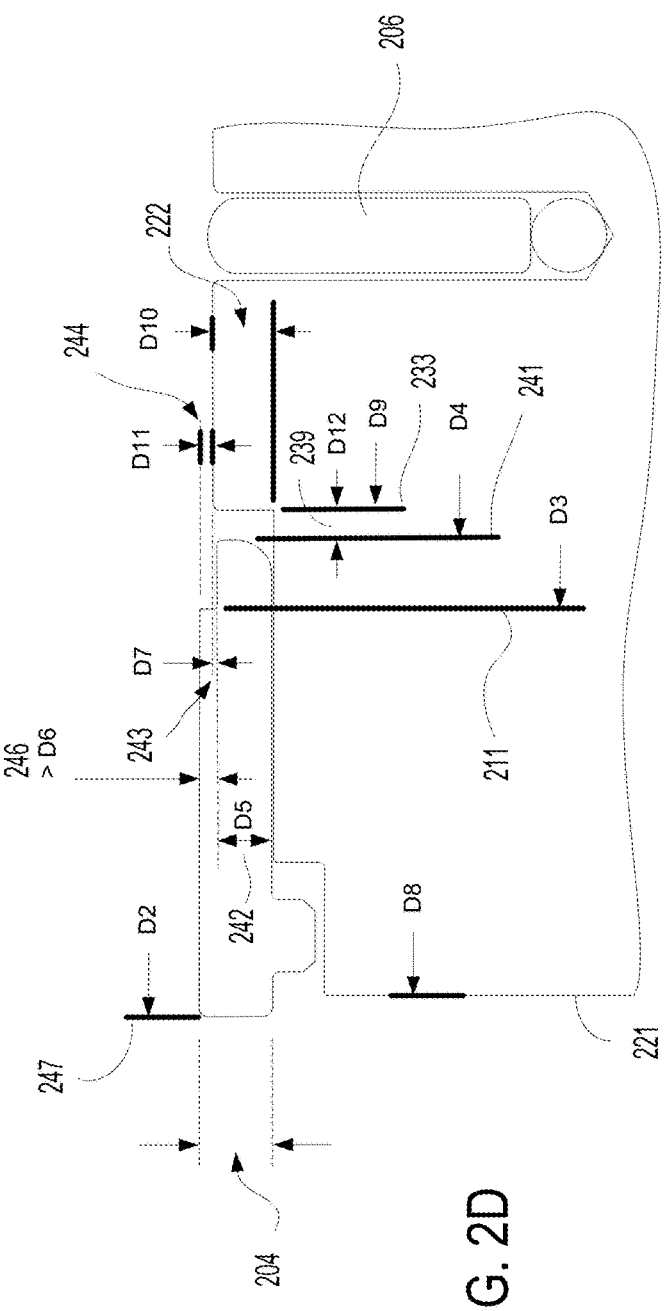
FIG. 2D is a magnification of the edge of the pedestal and focus ring of the pedestal assembly of FIG. 2A illustrating proposed dimensions for the geometries promoting improvement of uniformity of film dependent and performance stability over time, and illustrates the relative positioning of a shelf of the focus ring and top surface of the pedestal, in accordance with one embodiment of the present disclosure.

FIG. 2D is a magnification of the outer region 270 of the pedestal assembly 280 of FIG. 2A, and illustrates baseline dimensions for the geometries promoting improvement of uniformity of film dependent and performance stability over time, in accordance with one embodiment of the present disclosure. In addition, FIG. 2D illustrates the relative positioning of the shelf 240 of the focus ring 200 and top surface 220 of the pedestal 140'.

In one embodiment, geometric features of the standard pedestal bulk material of aluminum or ceramic (aluminum oxide) are designed to define and control the flow profile and buildup zones relative to the wafer edge 292 (e.g., near the outer region 270 of pedestal assembly 280). In particular, the geometries are chosen to compensate and minimize the influence of nearby material (e.g., precursor, radical, contaminants, etc.) that cannot be eliminated, but inherently influence the radical depletion. The geometry changes include modulating wafer height into the pocket, mesa height, wall angling, wall distance to wafer edge, and mesa (inner and outer) diameter. Additionally, geometries to create wafer edge sealing and contact (e.g., with pedestal 140' or focus ring 200) combined with side and/or backside gas purge are implemented to further assist maintaining the stable flow profile, depletion and buildup, and/or surface conditions at the wafer edge 292, in another embodiment. For example, each of the dimensions shown are proposed to be smaller than the shown dimensions, in embodiments.

In particular, FIG. 2D shows baseline dimensions of the pedestal 140'. For example, the outer edge 221 of pedestal 140' is shown having a diameter of approximately 13.81 inches, which is greater than the diameter of the wafer 290. In addition, the pedestal shelf 230 that is configured to support the focus ring 200 is defined as having an inner diameter 233 (dimension "D3" of approximately 11.375 inches). The shelf 230 extends from the inner diameter 233 to the edge 221. Also, the height 222 (dimension "D10" of approximately 0.155 inches) of the step 230 of pedestal 140' is shown.

FIG. 2D also shows an exemplary MCA 206 positioned within the pedestal 140'. In one embodiment, the position and one or more MCAs 206 patterned in pedestal 140' is designed to induce bowing of the wafer 290, such that the wafer edge 292 bows down with respect to the center of the wafer 290, especially during processing. The center of the wafer 290 may be located approximately at the central axis 311. Bowing may also occur at room temperature. For example, the wafer 290 may take on a slight dome shape with the center of the wafer higher than at least one portion of the wafer edge 292. The positioning of the MCAs 206 may be closer to the center of the wafer to induce bowing. In the opposite arrangement, the MCAs can be sized appropriately to require contact between the wafer edges and the Focus Ring step higher than the top plane of the MCAs, creating a bowl shape.

In addition, baseline dimensions for the focus ring 200 are shown. For example, the focus ring 200 has an inner diameter 241 (dimension "D4" of approximately 11.53 inches), and an outer diameter 247 (dimension "D2" of approximately 13.91 inches). The focus ring 200 has a mesa 212, which is defined by a mesa inner diameter 211 (dimension "D3" of approximately 11.87 inches). The shelf 240 is defined within the focus ring 200 between the inner diameter 211 of the mesa 212, and the inner diameter 241 (dimension "D4" of approximately 11.53 inches) of the focus ring 200.

In one embodiment the relative positioning of the shelf 240 of the focus ring 200 and top surface 220 of the pedestal 140' is modulated to promote sealing of the wafer edge 292, such as promoting contact with pedestal 140' and/or focus ring 200. For example, the distance of the shelf bottom 248 from the ring bottom surface 202 is modulated, such that the shelf bottom can be positioned below, at the same level, or above the top surface 220 of pedestal 140'. For example, the distance 242 (dimension "D5" ranging approximately from 0.143 to 0.188 inches) of the bottom surface 248 of shelf 240 from the bottom surface 202 of focus ring 200 is shown. In another embodiment, the height of riser 246 may be modulated to achieve the same effect. As shown in FIG. 2D, the distance 242 is smaller than a height of the riser 231 of the pedestal step 230, such that the shelf bottom 248 sits below the top surface 220 of pedestal 140'. For example, the height of riser 246 is shown (dimension "D6" that is greater than 0.033 inches), or in other words the difference between a height 204 of the focus ring 200 (from a ring bottom surface 202 to the mesa surface 210) and a distance from the ring bottom surface 202 to shelf bottom 248. Modulation of the shelf 240 is reflected in the distance 243 (dimension "D7" ranging between 0 and 0.012 inches) between the shelf bottom surface 248 and the top surface 220 of pedestal 140', when the bottom surface 248 sits below the top surface 220.

Figures 1, 2D:
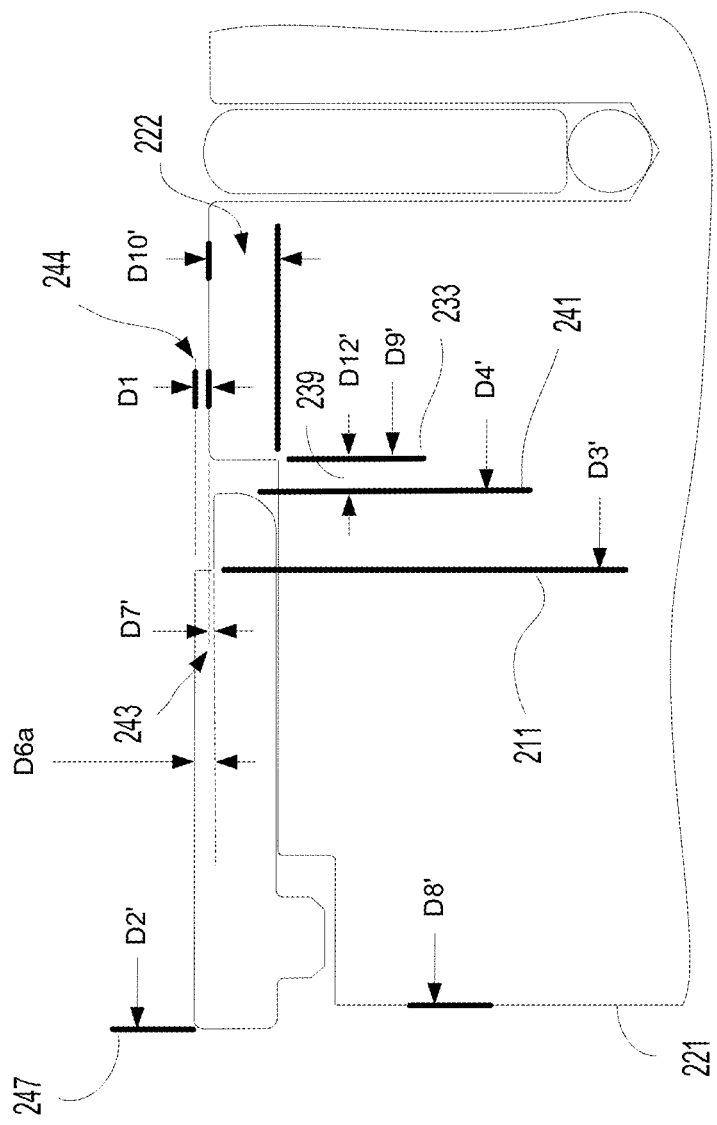

FIG. 2D-1 shows baseline dimensions of the pedestal 140' shown in FIG. 2D at temperature (e.g., 400 Celsius), in one embodiment. For example, the outer edge 221 diameter (dimension "D8" of approximately 13.873 inches) of pedestal 140' is shown, and has a diameter greater than the diameter of the wafer 290. In addition, the pedestal shelf 230 that is configured to support the focus ring 200 is defined as having an inner diameter 233 (dimension "D9" of approximately 11.427 inches). The shelf 230 extends from the inner diameter 233 to the edge 221. Also, the height 222 of the step 230 of pedestal 140' is shown (dimension "D10" of approximately 0.156 inches). Other dimensions are shown (e.g., "D2" of approximately 13.91 inches, "D6a" of approximately greater than 0.033 inches, "D7" of approximately 0.012 inches, "D10" of approximately 0.156 inches, "D12" of approximately 0.062 inches, "D3" of approximately 11.89 inches, and "D4" of approximately 11.55 inches).

In other embodiments, the bottom surface 248 of shelf 240 may be positioned at or above the top surface 220 of pedestal 140'. For example, FIG. 2E illustrates the outer region 270 of the pedestal assembly 280 shown in FIG. 2A, wherein the height of the riser 246' (dimension "D6b" of approximately 0.033 inches) is defined such that the bottom surface 248 is approximately level with the top surface 220 of pedestal 140'. That is, the distance 242 is approximately equal to the height of the riser 231 of pedestal step 230. Also, FIG. 2F illustrates the outer region 270 of pedestal assembly 280 shown in FIG. 2A, wherein the height of riser 246" (dimension "D6c" ranging approximately between 0.0 to 0.033 inches) is defined such that the bottom surface 248 is positioned higher than the top surface 220 of pedestal 140'. That is, the distance 242 is greater than the height of riser 231 of pedestal step 230.

The separation 244 (dimension "D11" of approximately 0.033 inches) between the mesa surface 210 and the top surface 220 of pedestal 140' is shown. In embodiments, the height 204 of focus ring 200 is lowered (e.g., less than D11) to promote sealing of the wafer edge 292, such as promoting contact with pedestal 140' and/or focus ring 200.

In one embodiment, the gap 239 between focus ring 200 and the pedestal riser 231 is modulated to promote sealing of the wafer edge 292, such as promoting contact with pedestal 140' and/or focus ring 200. In particular, the gap 239 (dimension "D12" of approximately 0.078 inches) is defined as the distance between the inner diameter 241 of the focus ring 200 and the inner diameter 233 of the pedestal step 230.

In another embodiment, the mesa inner diameter 211 is modulated to promote sealing of the wafer edge 292, such as promoting contact with pedestal 140' and/or focus ring 200. As shown, inner diameter 211 (dimension "D3" of approximately 11.87 inches) is shown, but may be made smaller to decrease the gap between the riser 246 and the edge 292 of wafer 290 during processing.

In still another embodiment, components of the pedestal 140' and/or focus ring 200 in the outer region 270 of the pedestal assembly 280 is treated to promote sealing of the wafer edge 292, such as promoting contact with pedestal 140' and/or focus ring 200. The treatment promotes a stable flow profile and surface conditions across multiple deposition cycles, while also reducing depletion and buildup near the wafer edge 292. In one embodiment, an O3 passivation is performed in this outer region 270. In other embodiments, ALD coatings are layered in this outer region 270. For example, coatings include Yttria, ALN, AlOx, ALON, SiC, and glass.

In still another embodiment, region 145 of pedestal 140' comprises alternate materials. For example, region 145 may comprise materials including Yttria, ALN, AlOx, ALON, SiC, and glass. Region 145 may form a pedestal ring of optimized geometry and of alternate material (Yttria, AlN, AlOx, ALON, SiC, glass), that is less conducive to radical recombination and the growth of film, that are speculated as contributing to the deterioration of uniformity over time. As theorized, as deposition on the wafer occurs, neighboring areas see a similar film grow. Unlike the wafer that is removed, the film on other surfaces (e.g., of pedestal 140' and focus ring 200 in outer region 270) is then exposed to clean processes and other gases during idle. These alternate materials reduce the effect of recombination and the growth of film by modulating or affecting the rate at which the film grows, changes, and recombines with radicals.

In still another embodiment, the focus ring 200 may comprise a consumable material (e.g., quartz, aluminum). The focus ring 200 may be replaced at periodic maintenance cycles, in order to mitigate the local film growth near the wafer edge. Replaceable materials of the focus ring 200 allow decoupling the influence and trending of film deposition and effects of clean processing steps by introducing a fresh material at the PM cycle. In addition, the decoupling is achieved by having a focus ring 200 of a material that is closer to the composition and temperature of either the wafer 290 (e.g., quartz) or the pedestal 140' (aluminum).

Figure 3A:
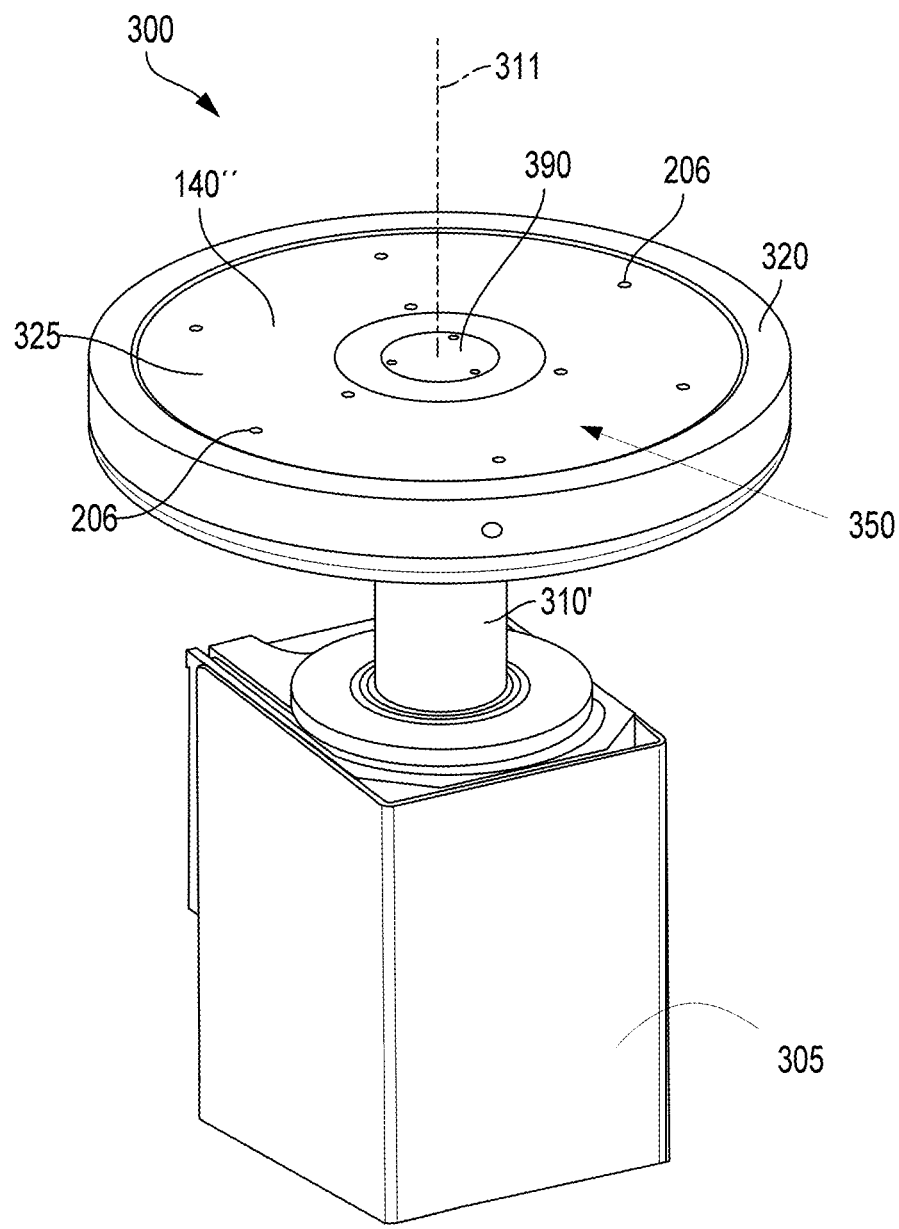
FIG. 3A is a perspective view of a substrate processing system including a lift pad and pedestal configuration, wherein the lift pad is smaller than a wafer, in accordance with one embodiment of the present disclosure.

FIG. 3A is a perspective view of a lift pad and pedestal configuration 300 of a substrate processing system configured to perform remote plasma processing, wherein the lift pad 390 is smaller than a wafer 290 disposed thereon, in accordance with one embodiment of the present disclosure. Geometric features of the standard pedestal bulk material of aluminum or ceramic (aluminum oxide) are designed to define and control the flow profile and buildup zones relative to the wafer edge 292 (e.g., near the annular rim 320 the pedestal 140"). In particular, the geometries are chosen to compensate and minimize the influence of nearby material (e.g., precursor, radical, contaminants, etc.) that cannot be eliminated, but inherently influence the radical depletion. The geometry changes include modulating wafer height into the pocket, mesa height of the annular rim 320, wall angling, wall distance to wafer edge, and mesa (inner and outer) diameter. Additionally, geometries to create wafer edge sealing and contact (e.g., with pedestal 140") combined with side and/or backside gas purge are implemented to further assist maintaining the stable flow profile, depletion and buildup, and/or surface conditions at the wafer edge 292, in another embodiment.

A pedestal and lift pad actuator 305 controls movement of the central shaft 310'. Because pedestal 140" is coupled to the central shaft 310', movement in the central shaft 310' is translated to the pedestal 140". In addition, the pedestal and lift pad actuator 305 controls movement of the pad shaft 330. Because the lift pad 390 is coupled to the pad shaft 330, movement in the pad shaft 330 is translated to the lift pad 390.

The pedestal 140" of the lift pad and pedestal configuration 300 includes a pedestal top surface 325 extending from the central axis 311 of the pedestal 140". A plurality of wafer supports 206 (e.g., MCAs) is disposed on the top surface 325. For example, FIG. 3C is an illustration of a pattern of MCAs 206 on pedestal 140", in one embodiment. In addition, a raised rim 320 is disposed on the outer region of the pedestal top surface 325, wherein the raised rim 320 is configured for blocking lateral movement of a wafer 290 that is placed on the pedestal 140".

Figure 3B:
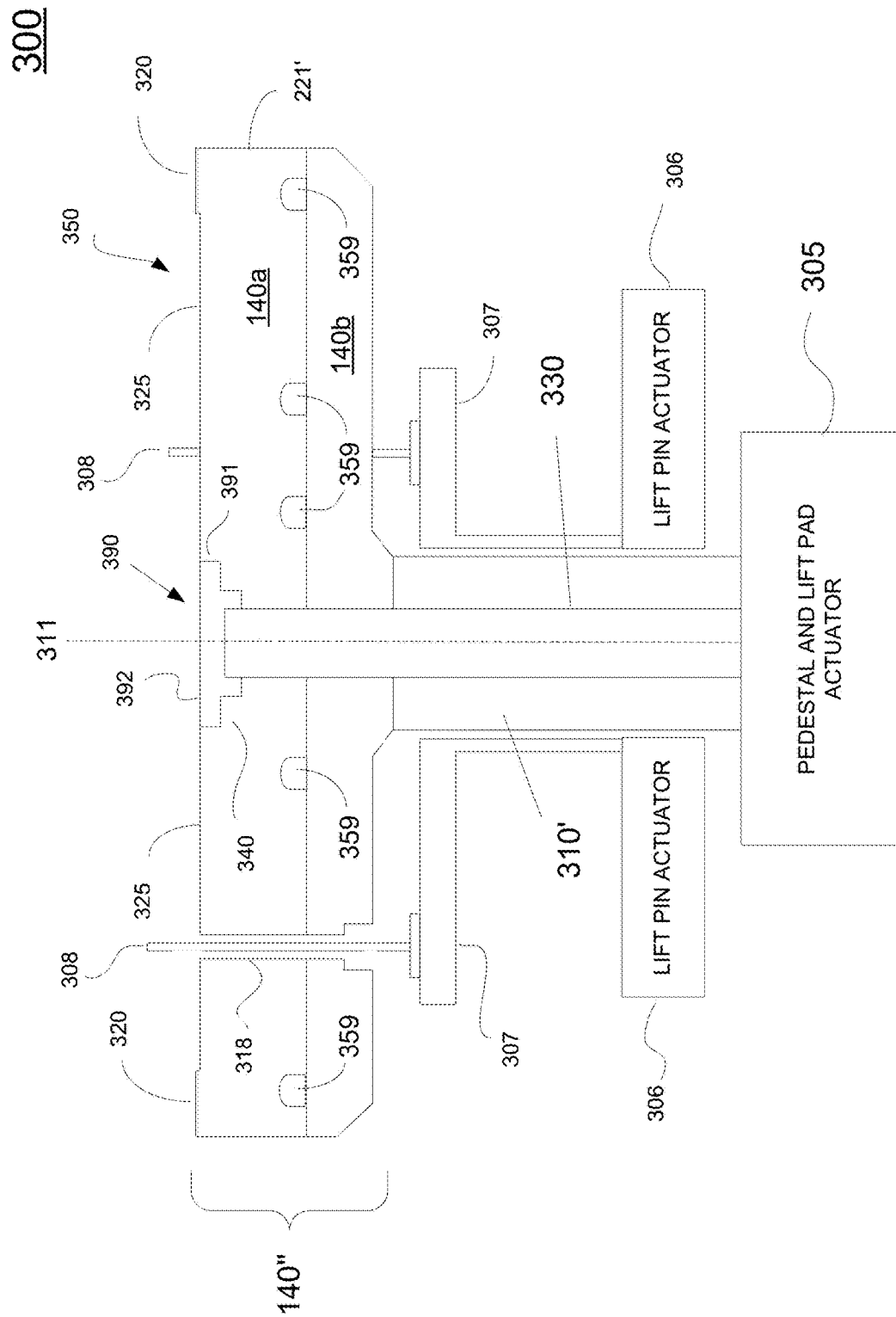
FIG. 3B is a cross-sectional diagram of the substrate processing system of FIG. 3A including a lift pad and pedestal configuration, wherein the lift pad is smaller than a wafer, in accordance with one embodiment of the present disclosure.
Figure 3C:
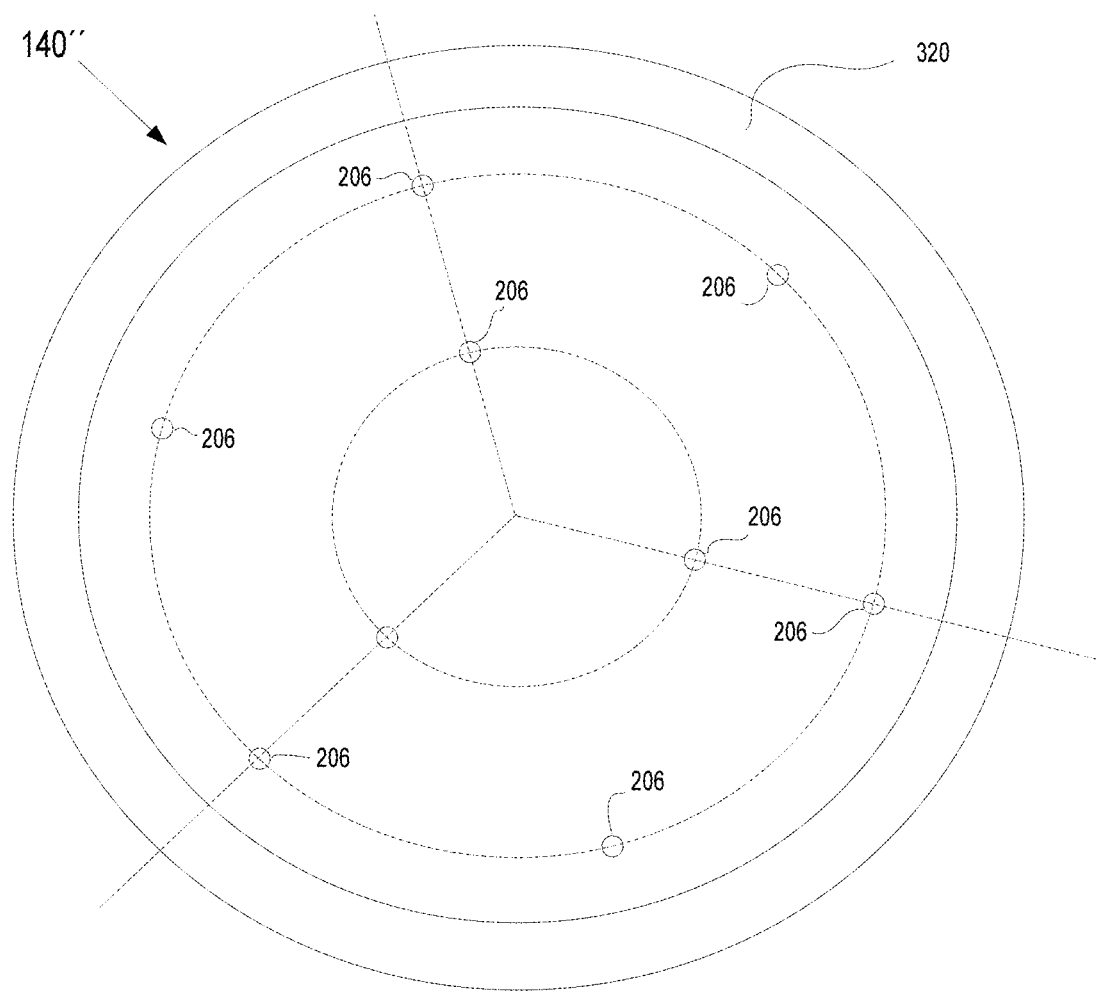
FIG. 3C is an illustration of a pattern of MCAs on a lift pad and pedestal configuration, in accordance with one embodiment of the present disclosure.

FIG. 3B is a cross-sectional diagram of the lift pad and pedestal configuration 300 of FIG. 3A, wherein the lift pad 390 is smaller than a wafer 290 disposed thereon, in accordance with one embodiment of the present disclosure. For purposes of illustration only, the pedestal 140" and the lift pad 390 are shown at positions and/or levels allowing for wafer processing.

The pedestal 140" includes a pedestal top surface 325 extending from the central axis 311 of the pedestal 140". The pedestal top surface 325 is configured to support a wafer when placed thereon. The top surface 325 may include one or more recesses to provide an interface between the pedestal 140" and the lift pad 390, such as a recess 340 configured to facilitate coupling between the pad shaft 330 and the lift pad 390. For example, the pedestal 140" includes a recess 340 centered in the pedestal top surface 325 and extending from the central axis 311 to a recess diameter 391. That is, recess 340 sits over a center portion of the pedestal top surface 325. In addition, the top surface 325 may form a pocket 350 defined by the raised annular rim 320. While the pedestal 140" may be described as generally having a circular shape when viewed from above, the footprint of the pedestal 140" may vary from a circle to accommodate for different features, such as a carrier ring support, focus ring, and end-effector access, etc.

As shown, pedestal 140" is connected to the actuator 305, which is configured for controlling movement of the pedestal 140". In particular, a central shaft 310' is coupled to the actuator 305 and the pedestal 140", such that the central shaft 310' extends between the actuator 305 and the pedestal 140". The central shaft 310' is configured to move the pedestal 140" along the central axis 311. As such, movement of the actuator 305 translates into movement of the central shaft 310', which in turn translates into movement of the pedestal 140".

In one embodiment, the pedestal top surface 325 includes a plurality of wafer supports 206 defined thereon (e.g., shown in FIG. 3A), wherein the wafer supports 206 are configured to support a wafer 290 at a wafer support level above the pedestal top surface 325. The wafer supports provide for a uniform and small gap between the pedestal 140" and any wafer 290 disposed thereon.

In addition, the pedestal 140" is shown having two segments 140a and 140b, for purposes of illustration only. For example, pedestal 140" may be formed in two segments to accommodate for formation during manufacturing the plurality of heating and/or cooling elements 359. As previously disclosed, it is appreciated that pedestal 140" is considered to be one element.

In the lift pad and pedestal configuration 300, the lift pad 390 includes a pad top surface 392 that extends from the central axis 311 to a pad diameter. The lift pad 390 is configured rest within the recess 340, wherein the recess 340 is configured to receive the lift pad 390. In particular, the lift pad top surface 392 is below the wafer 290 when the wafer 290 sits on the wafer supports 206 of the pedestal 140", such as in a process position (e.g., when performing plasma processing, treatment and/or film deposition). Further, the lift pad 390 is configured to move with the pedestal 140".

As shown, the lift pad 390 is connected to the actuator 305', which is configured for controlling movement of the lift pad 390. In particular, a pad shaft 330 is coupled to the actuator 305 and the pedestal 140", such that the pad shaft 330 extends between the actuator 305 and the pedestal 140". The pad shaft 330 is configured within the central shaft 310' that is connected to the pedestal 140". In particular, the pad shaft 330 is configured to move the lift pad 390 along the central axis 311. As such, movement of the actuator 305 translates into movement of the pad shaft 330, which in turn translates into movement of the lift pad 390. In one embodiment, the actuator 305 controls movement of both the lift pad 390 and the pedestal 140".

Specifically, the pad shaft 330 is configured to separate the lift pad 390 from the pedestal 140" for lift pad rotation, for example, during processing. That is, the lift pad 390 is configured to move up relative to the pedestal top surface 325 along the central axis 311, such that the lift pad 390 is separated from the pedestal top surface 325 by a process rotation displacement for purposes of rotating the lift pad 390. As such, a wafer 290 that is disposed upon the lift pad 390 is also separated from the pedestal 140". The pad shaft 330 is also configured to lower the lift pad 390 to rest upon the pedestal 140".

In particular, when the lift pad 390 is separated from the pedestal 140", the lift pad 390 is configured to rotate relative to the pedestal top surface 325 between at least a first angular orientation and a second angular orientation (e.g., between 0 degrees and 180 degrees), or may continually rotate during processing. This rotation may reduce the effects of the hardware signature of the pedestal during processing, and also reduces the effects of the chamber hardware signature during processing.

In other embodiments, the lift pad 390 provides for lift pin functionality to raise and lower the wafer during wafer delivery and processing. Specifically, the lift pad 390 is configured to move up relative to the central pedestal top surface 325 when the pedestal is in a bottommost downwards position, such that the lift pad 390 is separated from the pedestal top surface 325 by a displacement large enough for entry of an end-effector arm.

As shown in FIG. 3B, the pedestal 140" of the lift pad and pedestal configuration 300 includes a raised rim 320 disposed on the outer region of the pedestal top surface 325 (e.g., near outer edge 221' of pedestal 140"), wherein the raised rim 320 is configured for blocking lateral movement of a wafer 290 that is placed on the pedestal 140". That is, the rim 320 is a step above the pedestal top surface 325 at a height sufficient to block movement of the wafer.

The lift pad and pedestal configuration 300 includes a lift pin assembly that includes one or more lift pins 308. For purposes of illustration, the pedestal 140" and lift pad 390 are shown at a level allowing for lift pin 308 extension for purposes of wafer delivery, in accordance with one embodiment of the present disclosure. In particular, the lift pins 308 extend from the lift pad 390 through corresponding pedestal shafts 318 disposed in the pedestal 140" in such a manner such that an end-effector arm (not shown) carrying a wafer 290 (with or without a carrier ring) is able to maneuver into a position for delivering the wafer to the lift pins 308 or for receiving the wafer from the lift pins 308. Corresponding pedestal shafts 318 are aligned and configured to receive a corresponding lift pin 308 as the pedestal 140" moves in relation to the lift pins 308. It is understood that one or more lift pin shafts and corresponding lift pins may be configured within the lift pin assembly to lift up and place or remove the wafer 290 during wafer delivery. As shown, each of the lift pins 308 is coupled to a corresponding lift pin support 307 to effect movement. The lift pin supports 307 are coupled to a lift pin actuator 306. The lift pin support 307 may be of any shape (e.g., annular ring washer, arm extending from an annular base, etc.). In particular, during operation of the lift pin assembly, the lift pin 308 is attached to the lift pin support 307, and positioned to move within the lift pin shaft relative to the pedestal 140" to raise the wafer 290 above the pedestal top surface 325 and/or to lower the wafer 290 to rest upon the pedestal top surface 325 during wafer delivery and processing.

Figure 4A:
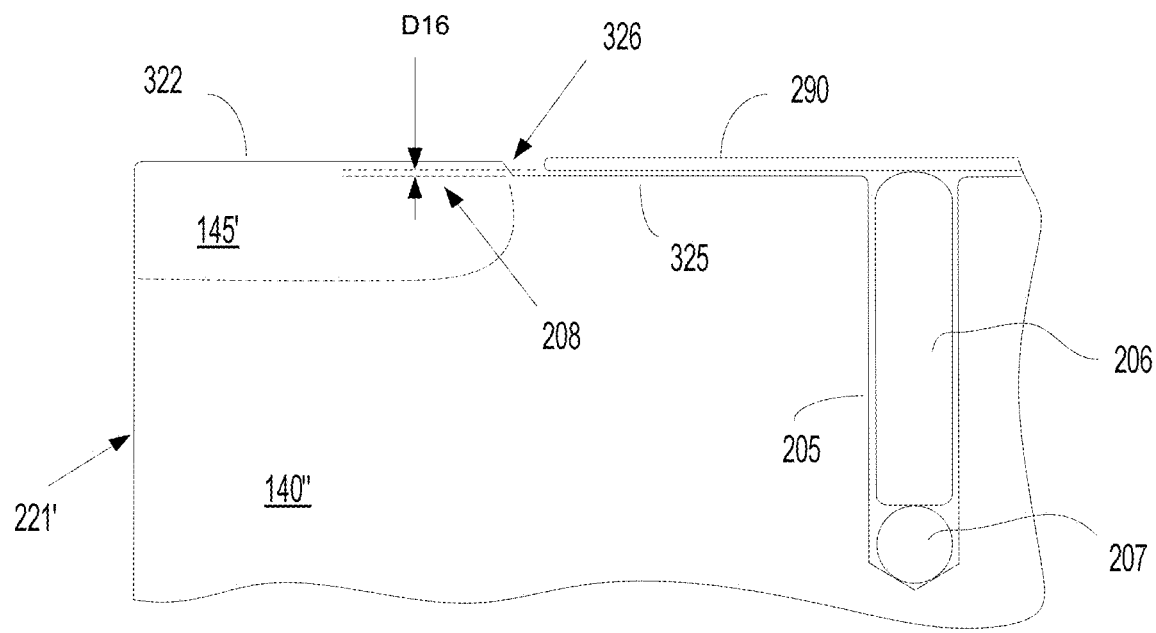
FIG. 4A is an illustration of the outer region of the pedestal of the lift pad and pedestal configuration of FIGS. 3A-3B, and includes a beveled surface of the raised annular rim of the pedestal, in accordance with one embodiment of the present disclosure.

FIGS. 4A-4D illustrate of the outer region 145' of the pedestal 140" of the lift pad and pedestal configuration 300 of FIGS. 3A-3B, and includes a beveled surface 326 of the raised annular rim 320 of the pedestal 140", in accordance with one embodiment of the present disclosure. As shown, the lift pad and pedestal configuration 300 includes a pedestal 140" having a pedestal top surface 325 extending from a central axis 311 of the pedestal 140". As shown, FIG. 4A shows the relative positioning of the raised annular rim 320 relative to a wafer disposed on the top surface 325 of the pedestal 140" that provides a limitation for movement of the wafer 290 and promotes improvement of uniformity of film dependent and performance stability over time.

In one embodiment, geometric features of the standard pedestal bulk material of aluminum or ceramic (aluminum oxide) are designed to define and control the flow profile and buildup zones relative to the wafer edge 292 when disposed on the pedestal 140". In particular, the geometries are chosen to compensate and minimize the influence of nearby material (e.g., precursor, radical, contaminants, etc.) that cannot be eliminated, but inherently influence the radical depletion. The geometry changes include modulating wafer height into the pocket 350, pocket height 351, wall angling 327, wall distance to wafer edge, and pocket outer diameter 352. Additionally, geometries to create wafer edge sealing and contact (e.g., with pedestal 140") combined with side and/or backside gas purge are implemented to further assist maintaining the stable flow profile, depletion and buildup, and/or surface conditions at the wafer edge 292, in another embodiment.

The pedestal 140" includes a raised annular rim 320 configured on the outer edge 221', wherein the annular rim 320 forms a pocket 350 defined by a pocket outer diameter 352 (dimension "D15" of approximately 11.968 inches) and the top surface 325 of the pedestal 140". The pocket 350 is configured to receive the wafer 290, and has a height 351 (dimension "D13" of approximately 0.35 inches). The raised annular rim 320 is configured to block lateral movement of the wafer 290 that is resting on the pedestal 140". In addition, the annular rim 320 includes a mesa surface 322 rising above the pedestal top surface 325. In one embodiment, the height 351 is modulated to promote sealing of the wafer edge 292 to pedestal 140". For example, the height 351 may be lowered such that the level of the wafer 290 is approximately equal to the level of the mesa surface 322.

Figure 4B:
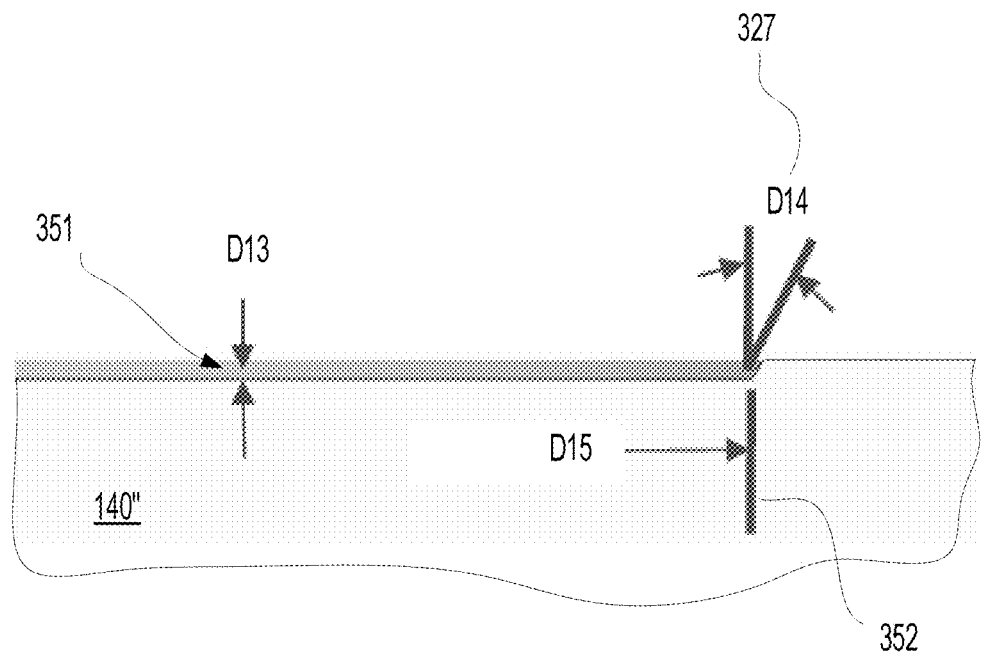
FIG. 4B is a magnification of the edge of the pedestal of the lift pad and pedestal configuration of FIGS. 3A-3B and showing a range of angles for a beveled surface of a raised annular rim of a pedestal, in accordance with one embodiment of the present disclosure.

The annular rim 320 includes a beveled surface 326, wherein the angulation is optimized to promote create wafer edge sealing and contact (e.g., with pedestal 140"). In particular, FIG. 4B illustrates the outer region 145' of the pedestal 140" of the lift pad and pedestal configuration 300 of FIG. 4A, and more particularly, shows the beveled surface 326 located approximately at the outer diameter 352 of the pocket 350. The beveled surface 326 is angled with respect to the top surface 325 of the pedestal 140" as shown by angle 327 (dimension D14 ranging between 0 and 90 degrees).

Figure 4C:
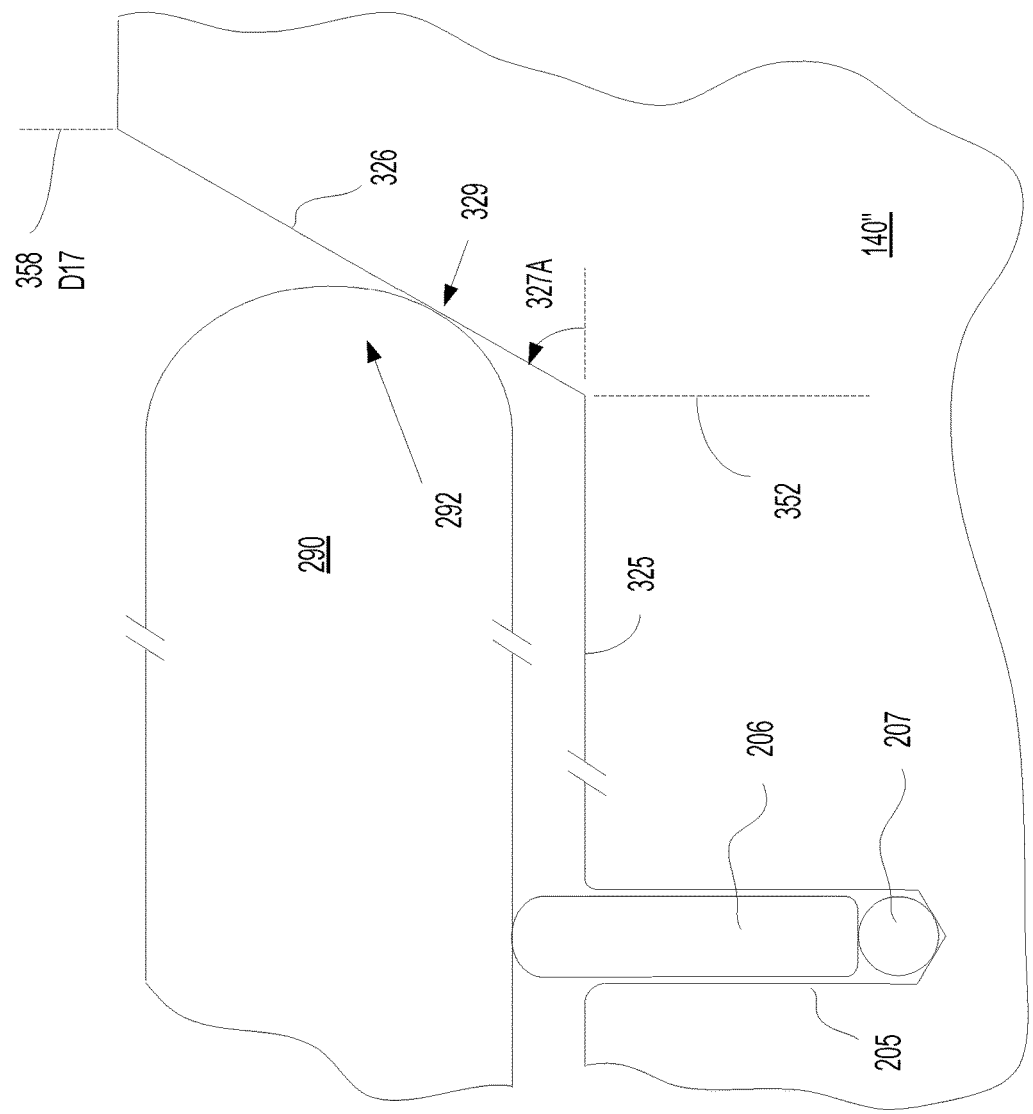
FIGS. 4C-4D are illustrations of the interface between a wafer and the beveled surface of a raised annular rim of a pedestal, in accordance with one embodiment of the present disclosure.

As shown in FIG. 4C, the beveled surface 326 of the annular rim 320 extends from an inner diameter 358 of the raised annular rim 320 and to an outer diameter 352 of the pocket 350 on the pedestal top surface 325, wherein the beveled surface is angled with respect to the pedestal top surface 325 at an angle 327 (of dimension "D14" of approximately 90 degrees or less with respect to a vertical line perpendicular to the pedestal top surface 325). The outer diameter 352 is shown (dimension "D15" of approximately 11.968 inches). In one embodiment, the outer diameter 352 may have a minimum dimension D15 of approximately 11.841 inches at room temperature, in one embodiment. In embodiments, the dimension of the outer diameter 352 is modulated to promote sealing of the wafer edge 292. That is, the outer diameter 352 is modulated to bring the beveled surface 326 closer to the edge 292 of the wafer 290 in order to promote sealing of the wafer edge 292 to the pedestal 140" during processing. Further, the inner diameter 358 of the raised annular rim 320 may be likewise modulated (dimension "D17"). In that manner, the influence of nearby material (e.g., precursor, radical, contaminants, etc.) that cannot be eliminated is reduced near the wafer edge 292.

Also shown, exemplary MCAs 206 are positioned within the pedestal 140". That is, pedestal top surface 325 includes one or more wafer supports 206 configured to support a wafer 290 at a wafer support level above the top surface 325. Each of the wafer supports 206 sits within a hole 205 that opens up at the top surface 220. Each wafer support 206 may further rest on a compliant spacer 207 that sits at the bottom of hole 205. Compliant spacer 207 is configured to prevent the wafer supports 206 (e.g., formed from sapphire) from breaking when a wafer 290 is placed thereon. In one embodiment, the positioning of the wafer supports 206 within hole 205 is configured to minimize the distance of the wafer support level 208 (dimension "D16 ranging approximately between 5 and 15 mil). In addition, the position and one or more MCAs 206 patterned in pedestal 140" is designed to induce bowing of the wafer 290, such that the wafer edge 292 bows down with respect to the center of the wafer 290, especially during processing, as previously described. The positioning of the MCAs 206 may be closer to the center of the wafer to induce bowing.

Figure 4D:
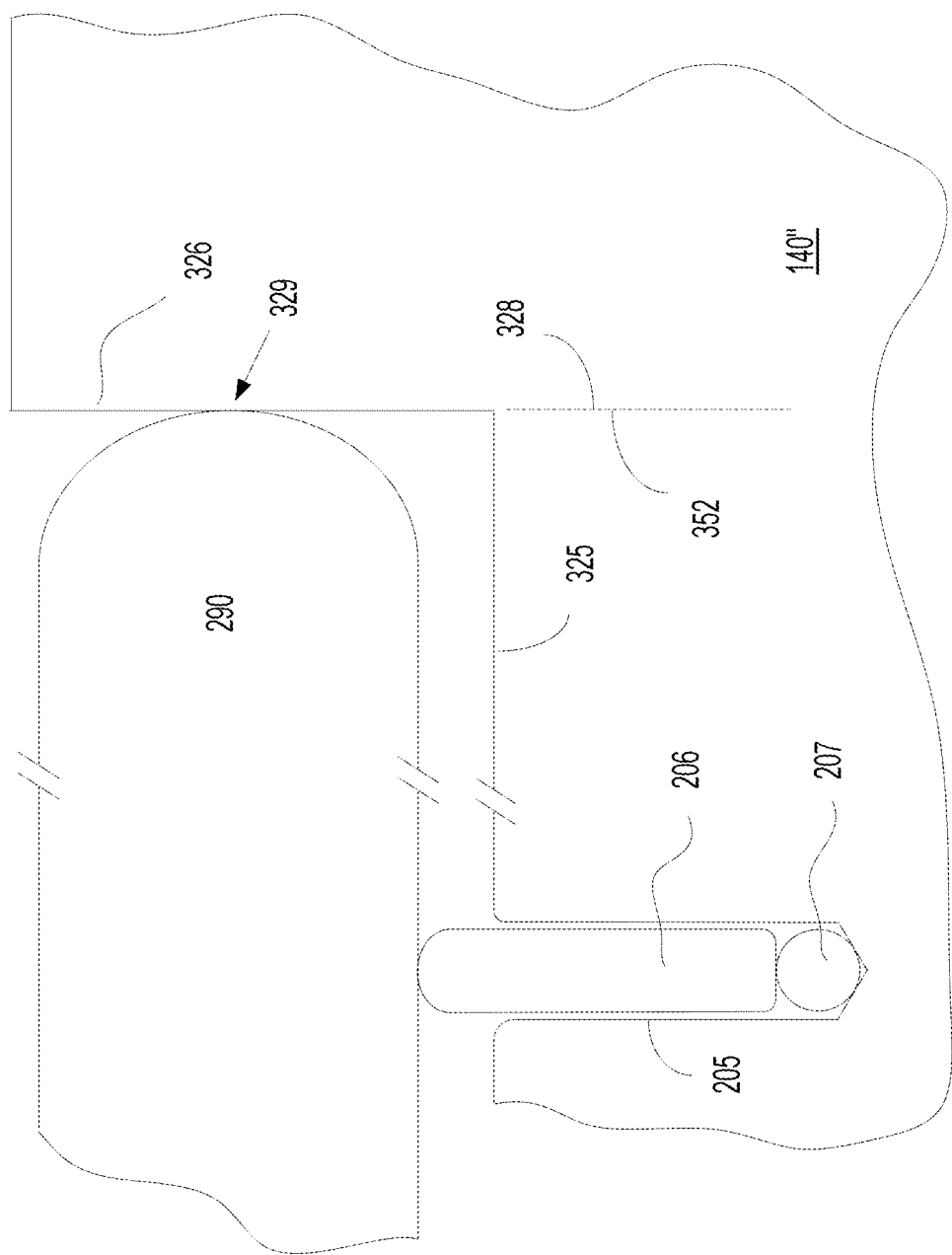

More particularly, FIGS. 4C-D are illustrations of the interface between the wafer 290 and the beveled surface 326 of the raised annular rim 320, in accordance with embodiments of the present disclosure. As shown in FIG. 4C, edge 292 of wafer 290 has a curved shape. For example, the shape may be an arc, or approximately semicircular. During processing, at least a portion of the edge 292 contacts the beveled surface 326 at contact point 329 in order to promote edge sealing of the wafer 290 to the pedestal 140". In traditional configurations, no contact is achieved between the edge 292 and the pedestal 140". As shown in FIG. 4C, the beveled surface is angled at approximately 60 degrees with respect to the pedestal top surface 325, and as such, a lower portion of the edge 292 is contacting the beveled surface 326. It is understood that as the angle 327A of the beveled surface 326 taken with respect to the pedestal top surface 325 (and opposite to angle 327 such that both form a 90 degree angle between the pedestal top surface 325 and a vertical line perpendicular to the pedestal top surface) becomes greater, the contact point 329 may contact other portions of the edge 292, such as near the center of the semicircle forming the edge 292. For example, as shown in FIG. 4D, the beveled surface 326 is near vertical with respect to the pedestal top surface 325, such that the outer diameter 352 of the pocket 350 is approximately equal to the inner diameter 358 of the raised annular rim 320.

In still another embodiment, outer region 145' of the pedestal 140" is treated to promote a stable flow profile and surface conditions across multiple deposition cycles, while also reducing depletion and buildup near the wafer edge 292. In one embodiment, an O3 passivation is performed on outer region 145'. In other embodiments, ALD coatings are layered in this outer region 145'. For example, coatings include Yttria, ALN, AlOx, ALON, SiC, and glass.

In still another embodiment, region 145' may form a pedestal ring of optimized geometry and of alternate material (Yttria, AlN, AlOx, ALON, SiC, glass), that is less conducive to radical recombination and the growth of film, that are speculated as contributing to the deterioration of uniformity over time. As theorized, as deposition on the wafer occurs, neighboring areas see a similar film grow. Unlike the wafer that is removed, the film on other surfaces (e.g., of pedestal 140" in outer region 145') is then exposed to clean processes and other gases during idle. These alternate materials reduce the effect of recombination and the growth of film by modulating or affecting the rate at which the film grows, changes, and recombines with radicals.

While specific embodiments have been provided for a pedestal assembly for use in remote plasma processing that implements a new wafer uniformity control knob including a delicately designed set of geometries, surface condition, and material composition nearby the wafer edge to further control the uniformity, as well as providing stable deposition patterns over time, these are described by way of example and not by way of limitation. Those skilled in the art having read the present disclosure will realize additional embodiments falling within the spirit and scope of the present disclosure.

It should be understood that the various embodiments defined herein may be combined or assembled into specific implementations using the various features disclosed herein. Thus, the examples provided are just some possible examples, without limitation to the various implementations that are possible by combining the various elements to define many more implementations. In some examples, some implementations may include fewer elements, without departing from the spirit of the disclosed or equivalent implementations.

Embodiments of the present disclosure may be practiced with various computer system configurations including hand-held devices, microprocessor systems, microprocessor-based or programmable consumer electronics, minicomputers, mainframe computers and the like. Embodiments of the present disclosure can also be practiced in distributed computing environments where tasks are performed by remote processing devices that are linked through a wire-based or wireless network.

With the above embodiments in mind, it should be understood that embodiments of the present disclosure can employ various computer-implemented operations involving data stored in computer systems. These operations are those requiring physical manipulation of physical quantities. Any of the operations described herein that form part of embodiments of the present disclosure are useful machine operations. Embodiments of the invention also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The disclosure can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing disclosure has been described in some detail for purposes of clarity of understanding, it will be apparent that certain changes and modifications can be practiced within the scope of the appended claims. Accordingly, the present embodiments are to be considered as illustrative and not restrictive, and embodiments of the present disclosure is not to be limited to the details given herein, but may be modified within the scope and equivalents of the appended claims.

What is claimed is:

1. An assembly for use in a process chamber, comprising:
a pedestal having a pedestal top surface extending from a central axis of the pedestal, the pedestal top surface having a plurality of wafer supports configured to support a wafer at a wafer support level above the pedestal top surface, wherein the pedestal top surface is horizontally oriented along a first plane perpendicular to the central axis;
a raised annular rim configured on an outer region of the pedestal top surface and configured to block lateral movement of the wafer that is resting on the pedestal, the raised annular rim having a mesa surface rising above the pedestal top surface, the raised annular rim and pedestal top surface forming a pocket configured to receive the wafer, wherein the mesa surface is horizontally oriented along a second plane perpendicular to the central axis, wherein the first plane and the second plane are in parallel; and
a beveled surface extending from an inner diameter of the raised annular rim to an outer diameter of the pocket on the pedestal top surface and configured to support a wafer, wherein the beveled surface rises uniformly from the pedestal top surface to the mesa surface of the raised annular rim at an angle taken with respect to the pedestal top surface that is less than 90 degrees, wherein each of the plurality of wafer supports sits within a hole that opens up at the pedestal top surface and rests on a compliant spacer that sits at a bottom of the hole, wherein the compliant spacer is configured to prevent each of the wafer supports from breaking and/or for height modulation;
a recess in the pedestal top surface centered about the central axis, the recess having a recess top surface; and
a lift pad configured to support the wafer,
wherein the recess is configured to receive the lift pad when the lift pad is resting on the recess top surface,
wherein a pad top surface of the lift pad is coplanar with the pedestal top surface when the lift pad is resting on the recess top surface,
wherein a coplanar surface including the pedestal top surface and the pad top surface when the lift pad is resting on the recess top surface is flat,
wherein the mesa surface extends from the outer diameter of the pocket to a curved surface that joins the mesa surface to the outer edge of the pedestal, wherein the outer edge of the pedestal is vertically oriented relative to the mesa surface.

2. The assembly of claim 1, wherein the beveled surface is approximately vertical with respect to the pedestal top surface.

3. The assembly of claim 1, wherein the wafer support level ranges between 0.005 to 0.015 inches.

4. The assembly of claim 1, wherein the inner diameter of the raised annular rim is less than 11.968 inches.

5. The assembly of claim 1, further comprising:
a lift pin assembly including a plurality of lift pins extending through a plurality of pedestal shafts configured within the pedestal.

6. The assembly of claim 1, wherein the outer ring of the pedestal forming the raised annular rim comprises a material taken from a group consisting essentially of:
Yttria, AlN, Alox, AlON, SiC, and glass.

7. The assembly of claim 1, wherein the outer diameter of the pocket is dimensioned such that a wafer edge of the wafer that is resting on the pedestal contacts the beveled surface.

8. The assembly of claim 1, wherein the outer diameter of the pocket extends beyond the wafer edge of the wafer that is resting on the pedestal.

* * * * *